(12) United States Patent
Kang et al.

(10) Patent No.: US 12,446,448 B2
(45) Date of Patent: Oct. 14, 2025

(54) DISPLAY PANEL, INCLUDING AN ALIGN KEY PATTERN, AND METHOD FOR FABRICATING THE SAME

(71) Applicant: Samsung Display Co., LTD., Yongin-si (KR)

(72) Inventors: Dong Gyu Kang, Asan-si (KR); Se Dong Kim, Cheonan-si (KR); Sang Ho Kim, Cheonan-si (KR); Yeon Taek Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 492 days.

(21) Appl. No.: 17/941,785

(22) Filed: Sep. 9, 2022

(65) Prior Publication Data

US 2023/0116218 A1 Apr. 13, 2023

(30) Foreign Application Priority Data

Oct. 7, 2021 (KR) .................. 10-2021-0133214

(51) Int. Cl.
*H10K 59/38* (2023.01)
*H10K 50/86* (2023.01)
*H10K 59/12* (2023.01)
*H10K 59/122* (2023.01)
*H10K 71/00* (2023.01)

(52) U.S. Cl.
CPC .......... *H10K 59/38* (2023.02); *H10K 50/865* (2023.02); *H10K 71/00* (2023.02); *H10K 59/1201* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 9,337,248 B2 | 5/2016 | Youk et al. | |
| 10,454,061 B2 | 10/2019 | Jo et al. | |
| 11,223,024 B2 | 1/2022 | Kim | |
| 11,600,804 B2 | 3/2023 | Kim et al. | |
| 11,800,772 B2 | 10/2023 | Oh et al. | |
| 2006/0279687 A1* | 12/2006 | Park | G02F 1/1333 349/142 |
| 2010/0245271 A1 | 9/2010 | Park | |

(Continued)

FOREIGN PATENT DOCUMENTS

| KR | 2008-0076554 A | 8/2008 |
|---|---|---|
| KR | 2010-0047841 A | 5/2010 |

(Continued)

*Primary Examiner* — Nduka E Ojeh
(74) *Attorney, Agent, or Firm* — Womble Bond Dickinson (US) LLP

(57) ABSTRACT

A display panel includes a first substrate including a first base substrate, a second substrate and a filling pattern. The first base substrate includes a display area including a plurality of pixel areas for image display and a non-display area around the display area, and an align key pattern including an opaque material in a part of the non-display area. The second substrate includes a second base substrate overlapping the first base substrate and including a transparent material, a light blocking structure in the non-display area, and a hole overlapping the align key pattern and penetrating the light blocking structure. The filling pattern is configured to fill the hole.

19 Claims, 26 Drawing Sheets

(56) References Cited

U.S. PATENT DOCUMENTS

| | | | |
|---|---|---|---|
| 2012/0200820 A1* | 8/2012 | Sato | G02F 1/133514 |
| | | | 257/E33.053 |
| 2017/0331072 A1* | 11/2017 | Jo | H10K 71/00 |
| 2019/0131359 A1* | 5/2019 | Kong | H10K 71/00 |
| 2021/0405473 A1* | 12/2021 | Liu | G02F 1/136209 |
| 2024/0122022 A1* | 4/2024 | Yagi | G02B 5/20 |

FOREIGN PATENT DOCUMENTS

| | | |
|---|---|---|
| KR | 2010-0108756 A | 10/2010 |
| KR | 2016-0038559 A | 4/2016 |
| KR | 2016-0069069 A | 6/2016 |
| KR | 2016-0141189 A | 12/2016 |
| KR | 2018-0024819 A | 3/2018 |
| KR | 2019-0059335 A | 5/2019 |
| KR | 2020-0136526 A | 12/2020 |
| KR | 2021-0101380 A | 8/2021 |

* cited by examiner

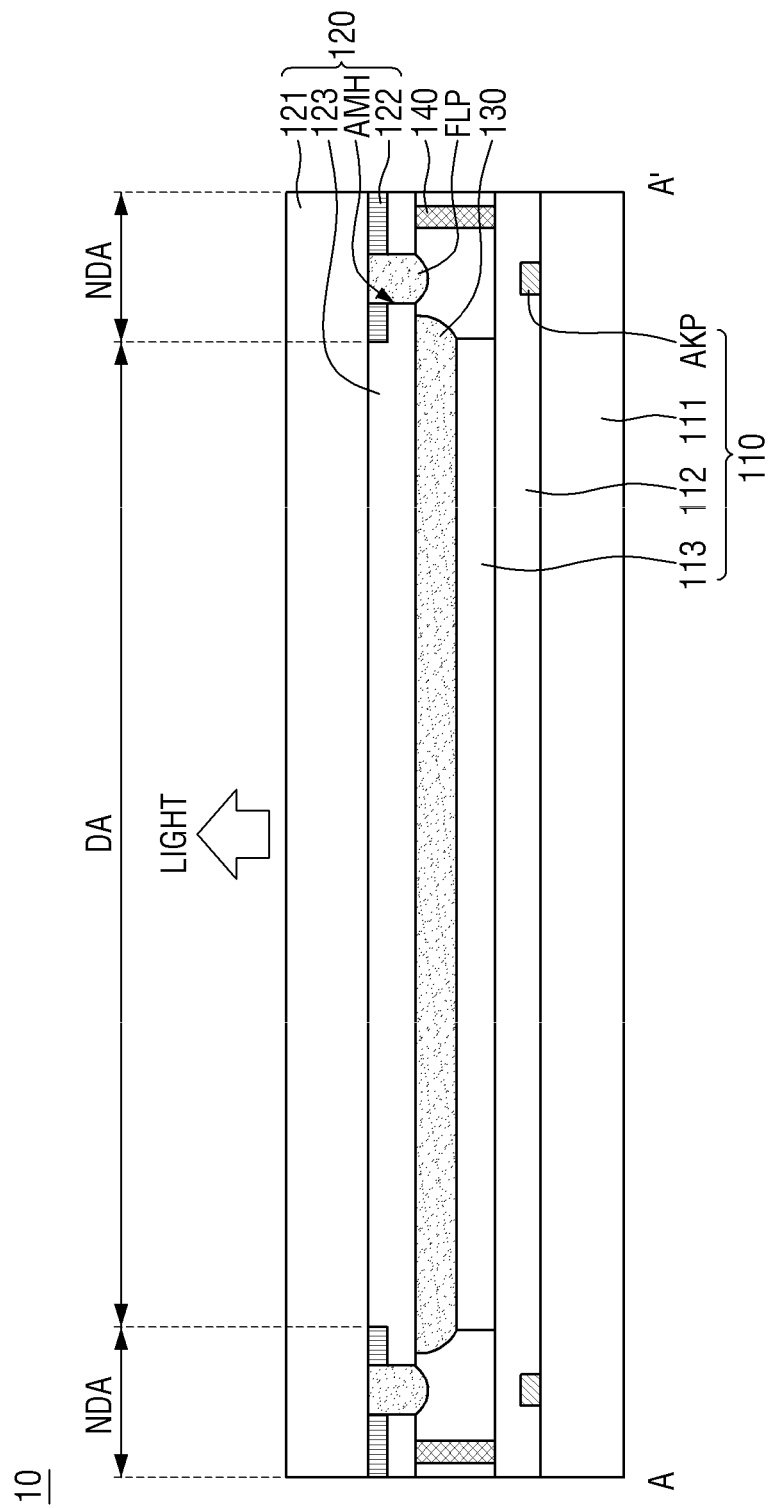

DISPLAY PANEL, INCLUDING AN ALIGN KEY PATTERN, AND METHOD FOR FABRICATING THE SAME

CROSS-REFERENCE TO RELATED APPLICATION

This application claims priority to and the benefit of Korean Patent Application No. 10-2021-0133214 filed on Oct. 7, 2021, in the Korean Intellectual Property Office, the entire contents of which is hereby incorporated by reference.

BACKGROUND

1. Field

The present disclosure relates to a display panel and a method for fabricating the same.

2. Description of the Related Art

With the advance of information-oriented society, more and more demands are placed on display devices for displaying images in one or more suitable ways. For example, display devices are employed in one or more suitable electronic devices such as smartphones, digital cameras, laptop computers, navigation devices, and/or smart televisions.

The display device includes a display panel to emit light for image display and a driver to supply signals and voltages for driving the display panel.

The display panel may include a pair of substrates facing (e.g., overlapping) each other and a polarization member or a light emitting member disposed between the pair of substrates.

The display panel may further include an align key pattern and an align matching hole corresponding to each other to check an alignment state between the pair of substrates. For example, when the align matching hole and the align key pattern overlap each other, the alignment state of the pair of substrates may be considered normal.

In some embodiments, the display panel may further include a filling layer to fill a space between the pair of substrates.

SUMMARY

One or more aspects of the present disclosure are directed towards a display panel capable of preventing or reducing unnecessary or undesirable yield reduction by preventing, or reducing the occurrence of, a shape of an align matching hole from being deformed and detected as a misalignment according to the arrangement of a filling layer, and a method of fabricating the same.

However, aspects of the present disclosure are not restricted to the one or more aspects set forth herein. The above and other aspects of the present disclosure will become more apparent to one of ordinary skill in the art to which the present disclosure pertains by referencing the detailed description of the present disclosure.

According to some embodiments, a display panel includes a first substrate including a first base substrate, a second substrate and a filling pattern. The first base substrate includes a display area including a plurality of pixel areas for image display and a non-display area around the display area, and an align key pattern including (e.g., formed of) an opaque material in a part of the non-display area. The second substrate includes a second base substrate overlapping (e.g., facing) the first base substrate and including (e.g., formed of) a transparent material, a light blocking structure on the second base substrate and in the non-display area, and a hole overlapping (e.g., facing) the align key pattern and penetrating the light blocking structure. The filling pattern is configured to fill the hole.

The display panel may further include a filling layer corresponding to at least the display area and filling a gap between the first substrate and the second substrate. The filling pattern may be the same as the filling layer in material.

The display panel may further include a sealing pattern corresponding to an edge of at least one selected from the first and second base substrates, between the first and second substrates, and bonding the first and second substrates to each other. The filling pattern and the filling layer are spaced apart from the sealing pattern.

The filling layer may extend at least to the non-display area and may be in contact with at least a part of the filling pattern.

The display area may further include a non-emission area which is a boundary between the plurality of pixel areas. The light blocking structure of the second substrate may further be in the non-emission area. The second substrate may further include a color filter layer disposed in the plurality of pixel areas, and a first capping layer covering the light blocking structure and the color filter layer. A portion of the second base substrate corresponding to the hole may be in contact with the filling pattern.

Each of the plurality of pixel areas may correspond to any one of first, second, and third colors, the first, second, and third colors being different from each other. The color filter layer may include a first color filter pattern configured to transmit light of the first color, a second color filter pattern configured to transmit light of the second color, and a third color filter pattern configured to transmit light of the third color.

The light blocking structure may include (e.g., formed by stacking) a portion of the first color filter pattern, a portion of the second color filter pattern, and a portion of the third color filter pattern.

The first substrate may further include a circuit array on the first base substrate and including a plurality of driving transistors corresponding to the plurality of pixel areas, and a light emitting array on the circuit array and including a plurality of light emitting elements corresponding to the plurality of pixel areas.

Each of the plurality of driving transistors may include a semiconductor layer including a channel area, a source area, and a drain area, the source area and the drain area being spaced apart from each other with the channel area therebetween, a gate electrode overlapping the channel area of the semiconductor layer, a source electrode coupled (e.g., connected) to the source area of the semiconductor layer, and a drain electrode coupled (e.g., connected) to the drain area of the semiconductor layer. The align key pattern may be on the same layer as at least one selected from the gate electrode, the source electrode, and the drain electrode, may be an island pattern, and may overlap (e.g., directly face) the filling pattern.

The second substrate may further include a color conversion layer on the first capping layer, a second capping layer covering the color conversion layer, and a low refractive layer between the color filter layer and the color conversion layer and comprising (e.g., formed of) a material having a lower refractive index than that of the color conversion layer. The color conversion layer may include a bank pattern around each of the plurality of pixel areas and in the non-display area, a first color conversion pattern corresponding to the first color filter pattern and to convert light of the third color into light of the first color, a second color conversion pattern corresponding to the second color filter pattern and to convert light of the third color into light of the second color, and a transmitting pattern corresponding to the third color filter pattern and to transmit light of the third color.

According to some embodiments, a method for fabricating a display panel is provided. The method includes preparing a first substrate, which includes a first base substrate including a display area including a plurality of pixel areas for image display and a non-display area around the display area, and an align key pattern comprising (e.g., formed of) an opaque material in a part of the non-display area, preparing a second substrate, which includes a second base substrate overlapping (e.g., facing) the first base substrate and comprising (e.g., formed of) a transparent material, a light blocking structure in the non-display area, and a hole penetrating the light blocking structure and exposing a part of the second base substrate in the non-display area, depositing a filling material on the second substrate in the display area and in the hole, disposing a sealing pattern corresponding to an edge of at least one selected from the first and second base substrates on at least one selected from the first and second substrates, aligning the first substrate and the second substrate with each other by utilizing the align key pattern and the hole, and bonding the first substrate to the second substrate by utilizing the sealing pattern.

In the depositing of the filling material, a filling pattern for filling the hole may be prepared by the filling material deposited in the hole. In the bonding of the first and second substrates, a filling layer may be prepared to fill a gap between the first substrate and the second substrate by the filling material deposited on the second substrate in the display area. The filling pattern and the filling layer may be spaced apart from the sealing pattern.

In the bonding of the first and second substrates, the filling layer may extend at least to the non-display area and may be in contact with at least a part of the filling pattern.

The display area may further include a non-emission area which is a boundary between the plurality of pixel areas. The preparing of the second substrate may include disposing the light blocking structure corresponding to the non-emission area and the non-display area, and a color filter layer corresponding to the plurality of pixel areas, on the second base substrate, disposing a first capping layer covering the light blocking structure and the color filter layer, and providing the hole by patterning the light blocking structure and the first capping layer.

Each of the plurality of pixel areas may correspond to any one of first, second, and third colors, the first, second, and third colors being different from each other. The third color may be shorter in wavelength than the second color, and the second color may be shorter in wavelength than the first color. The disposing of the light blocking structure and the color filter layer may include disposing a third color filter pattern configured to transmit light of the third color in the non-display area, the non-emission area, and pixel areas corresponding to the third color among the plurality of pixel areas, disposing a first color filter pattern configured to transmit light of the first color in the non-display area, the non-emission area, and pixel areas corresponding to the first color among the plurality of pixel areas, and disposing a second color filter pattern configured to transmit light of the second color in the non-display area, the non-emission area, and pixel areas corresponding to the second color among the plurality of pixel areas. The light blocking structure is formed by stacking a portion of the third color filter pattern, a portion of the first color filter pattern, and a portion of the second color filter pattern.

The preparing of the second substrate may further include, before disposing the first capping layer, disposing a low refractive layer on the color filter layer. The preparing of the second substrate may further include, before providing the hole, disposing a color conversion layer on the first capping layer, and disposing a second capping layer covering the color conversion layer. In the providing of the hole, the color conversion layer and the second capping layer are further patterned. The color conversion layer may include a bank pattern in the non-display area and around each of the plurality of pixel areas, a first color conversion pattern corresponding to the first color filter pattern and to convert light of the third color into light of the first color, a second color conversion pattern corresponding to the second color filter pattern and to convert light of the third color into light of the second color, and a transmitting pattern corresponding to the third color filter pattern and to transmit light of the third color.

The preparing of the first substrate may include disposing the align key pattern, and a circuit array including a plurality of driving transistors corresponding to the plurality of pixel areas, on the first base substrate, and disposing a light emitting array including a plurality of light emitting elements corresponding to the plurality of pixel areas on the circuit array.

The disposing of the circuit array and the align key pattern may include disposing a semiconductor layer corresponding to each of the plurality of pixel areas and including a channel area, a source area, and a drain area, the source area and the drain area being respectively at two sides of the channel area, disposing a gate insulating layer covering the channel area of the semiconductor layer, and a gate electrode overlapping the channel area of the semiconductor layer with the gate insulating layer therebetween, and disposing a source electrode coupled (e.g., connected) to the source area of the semiconductor layer and a drain electrode coupled (e.g., connected) to the drain area of the semiconductor layer on an interlayer insulating layer covering the semiconductor layer, the gate insulating layer, and the gate electrode. The align key pattern may be disposed on the same layer as at least one selected from the gate electrode, the source electrode, and the drain electrode is on, and the align key pattern may be formed as an island pattern.

Each of the plurality of pixel areas may correspond to any one of first, second, and third colors, the first, second, and third colors being different from each other. The disposing of the light blocking structure and the color filter layer may include disposing the light blocking structure by patterning a light absorbing material layer on the second base substrate, disposing a first color filter pattern configured to transmit light of the first color on pixel areas corresponding to the first color among the plurality of pixel areas, disposing a second color filter pattern configured to transmit light of the second color on pixel areas corresponding to the second color among the plurality of pixel areas, and disposing a third color filter pattern configured to transmit light of the third color on pixel areas corresponding to the third color among the plurality of pixel areas.

According to some other embodiments, a display panel includes a first substrate including a display area including a plurality of pixel areas for image display and a non-display area around the display area, a second substrate overlapping (e.g., facing) the first substrate and including a light blocking structure in the non-display area and a hole penetrating the light blocking structure, a filling pattern configured to fill the hole, and a filling layer corresponding to at least the display area and filling a gap between the first substrate and the second substrate. The filling pattern is the same as the filling layer in material.

The display panel according to some embodiments includes a filling pattern filling the align matching hole. Therefore, because the align matching hole is not maintained as a cavity, but is filled with the filling pattern, foreign substances such as air bubbles may be blocked from being inserted into or entering the align matching hole even when the filling layer extends to the align matching hole. For example, due to the arrangement of the filling pattern, the shape of the align matching hole may be maintained regardless of the arrangement of the filling layer. Accordingly, detection of misalignment due to shape deformation of the align matching holes can be prevented or reduced, thereby preventing or reducing unnecessary or undesirable reduction in yield.

In some embodiments, in the method for fabricating the display panel, when the filling material is deposited for disposition of the filling layer, the filling material for disposition of the filling pattern is also deposited. Thus, even when the filling pattern is further included, it is possible to prevent or reduce the fabricating process from being complicated.

However, the aspects of the present disclosure are not limited to the aforementioned aspects, and other aspects are included in the present specification.

BRIEF DESCRIPTION OF THE DRAWINGS

The above and other aspects and features of the present disclosure will become more apparent by describing in more detail embodiments thereof with reference to the attached drawings, in which:

FIGS. 18, 19, 20, 21, 22, 23, 24, 25 and 26 are cross-sectional views of respective acts of FIG. 17.

DETAILED DESCRIPTION

Figure 1:
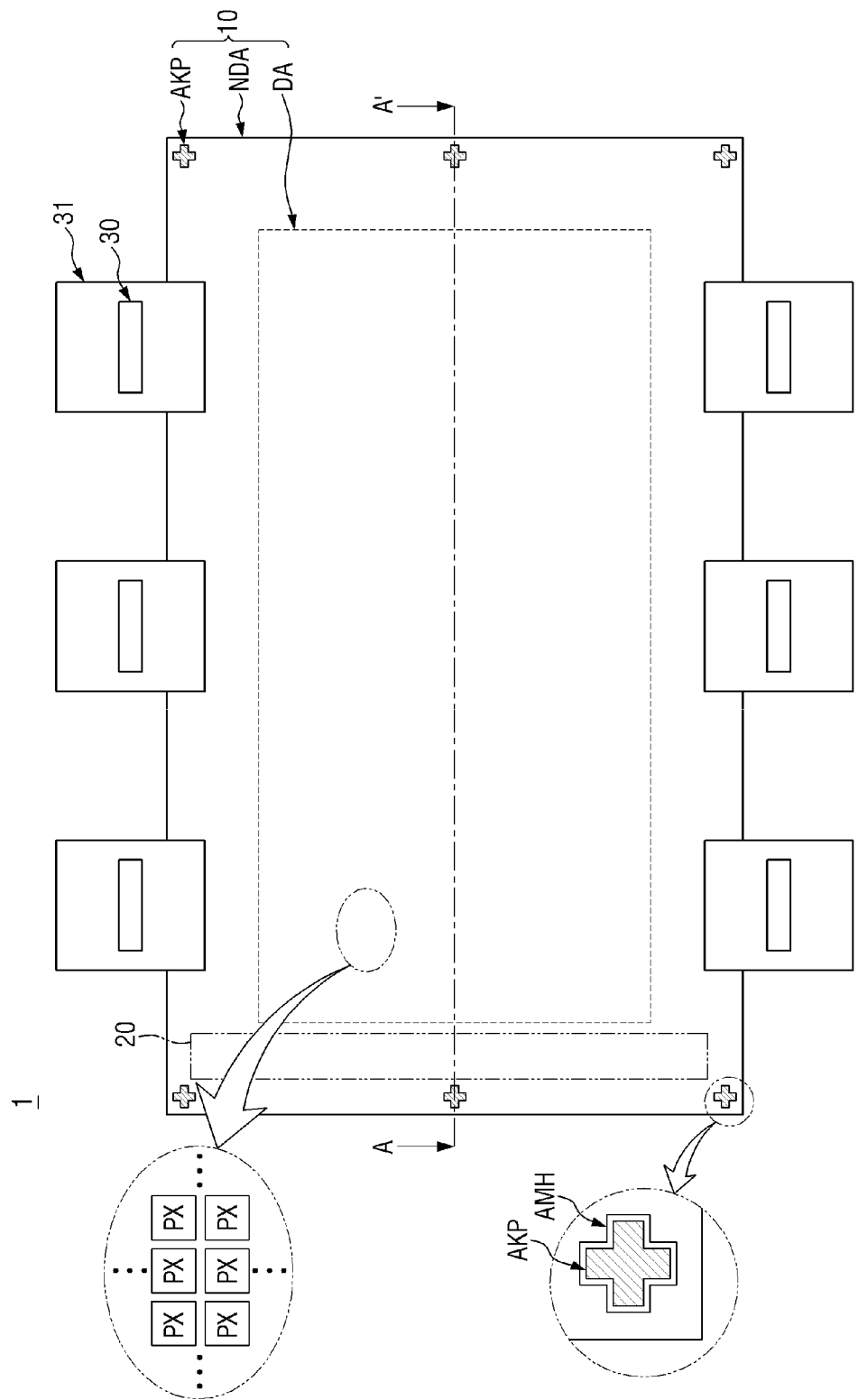
FIG. 1 is a plan view illustrating a display device according to some embodiments.

Some embodiments will now be described more fully hereinafter with reference to the accompanying drawings. The embodiments may, however, be provided in different suitable forms and should not be construed as limiting. The same reference numbers indicate the same or similar components throughout the disclosure. In the accompanying drawings, the thickness of layers and regions may be exaggerated for clarity.

Some of the parts which are not associated with the description may not be provided in order to conveniently describe some embodiments of the disclosure.

It will also be understood that when a layer is referred to as being "on" another layer or substrate, it can be directly on the other layer or substrate, or one or more intervening layers may also be present. In contrast, when an element is referred to as being "directly on" another element, there may be no intervening elements present.

Further, the phrase "in a plan view" refers to when an object portion is viewed from above, and the phrase "in a schematic cross-sectional view" refers to when a schematic cross-section taken by vertically cutting an object portion is viewed from the side. The terms "overlap" or "overlapped" refer to how a first object may be above or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may refer to how a first object directly or indirectly opposes a second object. In a case in which a third object intervenes between a first and second object, the first and second objects may be understood as being indirectly opposed to one another, although still facing each other.

The spatially relative terms "below," "beneath," "lower," "above," "upper," and/or the like, may be utilized herein for ease of description to describe the relations between one element or component and another element or component as illustrated in the drawings. It will be understood that the spatially relative terms are intended to encompass different orientations of the device in utilize or operation, in addition to the orientation depicted in the drawings. For example, in the case where a device illustrated in the drawing is turned over, the device positioned " " or "beneath" another device may be placed "above" the another device. Accordingly, the illustrative term "below" may include both (e.g., simultaneously) the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to the another element with one or more intervening elements interposed therebetween. It will be further understood that when the terms "comprises," "comprising," "has," "have," "having," "includes" and/or "including" are utilized, they may specify the presence of stated features, integers, steps, acts, operations, elements and/or components, but do not preclude the presence or addition of other features, integers, steps, acts, operations, elements, components, and/or any combination thereof.

It will be understood that, although the terms "first," "second," "third," and/or the like may be utilized herein to describe one or more suitable elements, these elements should not be limited by these terms. These terms are utilized to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as utilized herein is inclusive of the stated value and refers to within an acceptable range of deviation for the particular value as determined by one of ordinary skill in the art, considering the measurement in question and the error associated with measurement of the particular quantity (for example, the limitations of the measurement system). For example, "about" may refer to within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to refer to "A, B, or A and B." The terms "and" and "or" may be utilized in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to refer to "A, B, or A and B."

Unless otherwise defined or implied, all terms utilized herein (including technical and scientific terms) have the same meaning as commonly understood by those skilled in the art to which this disclosure pertains. It will be further understood that terms, such as those defined in commonly utilized dictionaries, should be interpreted as having a meaning that is consistent with their meaning in the context of the relevant art and will not be interpreted in an ideal or excessively formal sense unless clearly defined in the specification. As used herein, the use of the term "may," when describing embodiments of the present disclosure, refers to "one or more embodiments of the present disclosure."

FIG. 1 is a plan view illustrating a display device according to some embodiments.

Referring to FIG. 1, a display device 1 is a device for displaying a moving image and/or a still image. The display device 1 may be utilized as a display screen of one or more suitable devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 1 may be a light emitting display device such as an organic light emitting display utilizing an organic light emitting diode, a quantum dot light emitting display including a quantum dot light emitting layer, an inorganic light emitting display including an inorganic semiconductor, and/or a micro light emitting display utilizing a micro or nano light emitting diode (LED). In the following description, it is assumed that the display device 1 is an organic light emitting display device, but the present disclosure is not limited thereto.

As illustrated in FIG. 1, the display device 1 includes a display panel 10 providing a screen for image display and drivers 20 and 30 for driving the display panel 10.

The display panel 10 may have a rectangular flat plate shape. However, the planar shape of the display panel 10 is not limited to the example in FIG. 1, and may have a circular or another polygonal shape in a plan view or a three dimensional shape (e.g., a curved shape) including the same. In some embodiments, the display panel 10 may be formed flexibly such that it can be curved, bent, folded, or rolled.

The display panel 10 includes a display area DA for image display and a non-display area NDA around (e.g., surrounding) the display area DA.

The non-display area NDA is an area in which an image is not displayed and may be maintained in a set or predetermined color such as black. In some embodiments, the non-display area NDA may have a frame shape around (e.g., surrounding) the display area DA.

The display area DA may occupy most of the display panel 10. The display area DA may be disposed at the center of each of both (e.g., simultaneously) surfaces or one surface of the display panel 10.

The display area DA includes a plurality of pixel areas PX arranged, for example, in parallel with each other. Each of the plurality of pixel areas PX is a unit area to emit light having a luminance according to an image signal.

In some embodiments, the display area DA may further include a non-emission area (NEM in FIG. 3) that is a boundary between the plurality of pixel areas PX. For example, the non-emission area may be around (e.g., surround) the pixel areas PX.

The display panel 10 further includes at least one align key pattern AKP disposed in the non-display area NDA and at least one align matching hole AMH (hereinafter, "hole" may refer to "align matching hole") corresponding one-to-one to at least one align key pattern AKP. For example, any one of first and second substrates (110 and 120 in FIG. 2) provided on the display panel 10 may include the align key pattern AKP and the other includes the align matching hole AMH (e.g., the corresponding align matching hole AMH). In some embodiments, one or more align key patterns may be included in the first substrate 110 and one or more align matching holes corresponding to the one or more align key patterns in the first substrate 110 may be included in the second substrate 120, and one or more other align key patterns may be in the second substrate 120 and one or more other align matching holes corresponding to the one or more other align key patterns in the second substrate 120 may be included in the first substrate 110.

The align key pattern AKP is formed of an opaque material having relatively, suitably, or desirably high visibility.

The align matching hole AMH has a shape and a position corresponding to the align key pattern AKP.

Accordingly, when the align key pattern AKP and the align matching hole AMH corresponding to each other are adjusted to positions to overlap each other when aligning the first and second substrates 110 and 120, the alignment state of the first and second substrates 110 and 120 may be considered as normal. For example, the first and second substrates 110 and 120 may be coupled to each other (e.g., after being separately fabricated), and one or more align key patterns AKP and one or more corresponding align matching holes AMH may be included and utilized to properly align the first and second substrates 110 and 120 when coupling the first and second substrates 110 and 120 together.

According to the example of FIG. 1, the display panel 10 includes six align key patterns AKP disposed at each of the corners and in the central portion of the short sides. However, this is only an example, and unlike the example of FIG.

1, the display panel 10 may include at least one align key pattern AKP distributedly disposed suitably in the non-display area NDA. In some embodiments, the display panel 10 may include an align key pattern disposed in the display area DA without affecting the arrangement and driving of the plurality of pixel areas PX.

The drivers 20 and 30 supply signals and voltages for controlling the luminance for an image frame of each of the plurality of pixel areas PX.

Among the drivers, a scan driver 20 may be implemented as a circuit embedded in the display panel 10.

Among the drivers, a data driver 30 may be implemented as an integrated circuit chip, and may be mounted on the display panel 10 or be mounted on a circuit board 31 coupled (e.g., connected) to the display panel 10.

Figure 2:
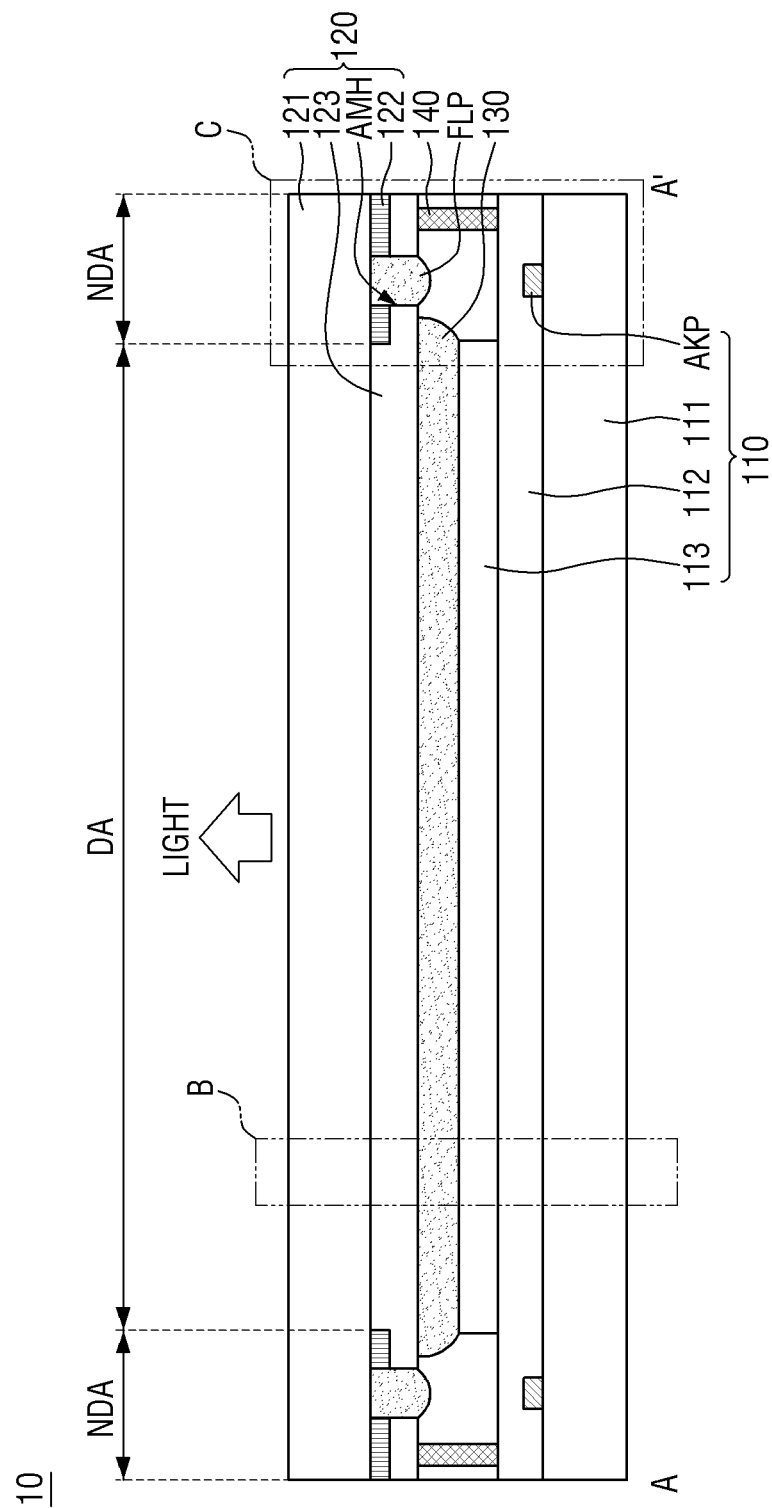
FIG. 2 is a schematic cross-sectional view of line A-A' of FIG. 1.

FIG. 2 is a schematic cross-sectional view of line A-A' of FIG. 1.

Referring to FIG. 2, the display panel 10 includes a first substrate 110 and a second substrate 120 overlapping (e.g., facing) each other.

The first substrate 110 includes a first base substrate 111 including the display area DA and the non-display area NDA and the align key pattern AKP disposed on a portion of the non-display area NDA of the first base substrate 111.

The first substrate 110 may further include a circuit array 112 disposed on the first base substrate 111 and a light emitting array 113 disposed on the circuit array 112.

The circuit array 112 includes a plurality of driving transistors (DTR in FIG. 5) corresponding to the plurality of pixel areas PX.

The light emitting array 113 includes a plurality of light emitting elements (EMD in FIG. 5) corresponding to the plurality of pixel areas PX.

As described above, each of the pixel areas PX includes the driving transistor DTR and the light emitting element EMD to emit light of luminance corresponding to a driving signal of the driving transistor DTR.

The align key pattern AKP is for checking the alignment between the first and second substrates 110 and 120 from the outside. The align key pattern AKP may be formed of an opaque material for external visibility. For example, the align key pattern AKP may be provided as any one of the conductive layers implementing the circuit array 112. For example, the align key pattern AKP may be disposed on the same layer as a gate electrode of the driving transistor DTR, or may be disposed on the same layer as a source electrode and a drain electrode of the driving transistor DTR.

Moreover, the align key pattern AKP may be spaced apart from opaque patterns on a plane (e.g., in the plan view) that may be around (e.g., surround) the align key pattern AKP (e.g., in the plan view) to improve visibility. For example, like the example in FIG. 1, the align key pattern AKP may be formed of an island pattern in a floating state.

The second substrate 120 includes a second base substrate 121 overlapping (e.g., facing) the first base substrate 111 and formed of a transparent material, a light blocking structure 122 disposed in the non-display area NDA of the second base substrate 121, and the align matching hole AMH overlapping (e.g., facing) the align key pattern AKP and penetrating the light blocking structure 122. In some embodiments, the light blocking structure 122 is around (e.g., surrounds) the align matching hole AMH in the plan view.

The second substrate 120 may further include a color array 123 for displaying a color image. The color array 123 includes a color filter layer (1231 in FIG. 3) disposed in the plurality of pixel areas PX.

The second base substrate 121 may be formed of a transparent material to emit light of the light emitting array 113 to the outside.

The light blocking structure 122 is disposed in the non-display area NDA of one surface (e.g., on one surface) of the second base substrate 121 in order to prevent or reduce light leakage in the non-display area NDA.

The align matching hole AMH is for detecting the shape of the align key pattern AKP disposed in the non-display area NDA on the second base substrate 121 side. The align matching hole AMH may be provided by removing a portion of the light blocking structure 122 having a position and a shape corresponding to the align key pattern AKP.

In some embodiments, the display panel 10 further includes a filling pattern FLP filling the align matching hole AMH.

Accordingly, because the align matching hole AMH is not in a cavity state, but is filled with the filling pattern FLP, shape deformation of the align matching hole AMH due to insertion of foreign substances can be prevented or reduced.

Moreover, the display panel 10 may further include a filling layer 130 and a sealing pattern 140 disposed between the first substrate 110 and the second substrate 120.

The filling layer 130 corresponds to at least the display area DA and fills a gap between the first substrate 110 and the second substrate 120.

For example, the filling layer 130 may be filled in at least the display area of the gap between the first substrate 110 and the second substrate 120. The filling layer 130 may be formed of a transparent filling material. Accordingly, the effect of a physical impact on each component disposed on each of the first and second substrates 110 and 120 may be reduced, and a decrease in light output may be minimized or reduced.

In some embodiments, the filling layer 130 may further strengthen the bond between the first and second substrates 110 and 120 by including (e.g., being) an adhesive material.

The filling layer 130 may include (e.g., be) an organic material. For example, the filling layer 130 may be formed of a Si-based organic material, an epoxy-based organic material, and/or the like.

Moreover, the filling layer 130 and the filling pattern FLP may be formed of the same material. For example, when the filling material for forming the filling layer 130 is deposited, the filling material may be deposited not only in the display area DA of the second substrate 120 but also on (e.g., into) the align matching hole AMH. Accordingly, it is possible to reduce the complexity of the fabricating process due to the addition of the filling pattern FLP.

The sealing pattern 140 may correspond to (e.g., may be at) an edge of at least one selected from the first and second base substrates 111 and 121, may be disposed in the non-display area NDA, and may bond the first and second substrates 110 and 120 with each other.

For example, the sealing pattern 140 may be made in a frame-shaped pattern (e.g., have a closed-line shape in the plan view) corresponding to at least one selected from the edges of the first and second base substrates 111 and 121 and is disposed in the non-display area NDA between the first and second substrates 110 and 120.

The sealing pattern 140 may include (e.g., be) an organic material having an adhesive property. For example, the sealing pattern 140 may be formed of an epoxy resin.

The first and second substrates 110 and 120 may be bonded to each other by the sealing pattern 140.

Figure 3:
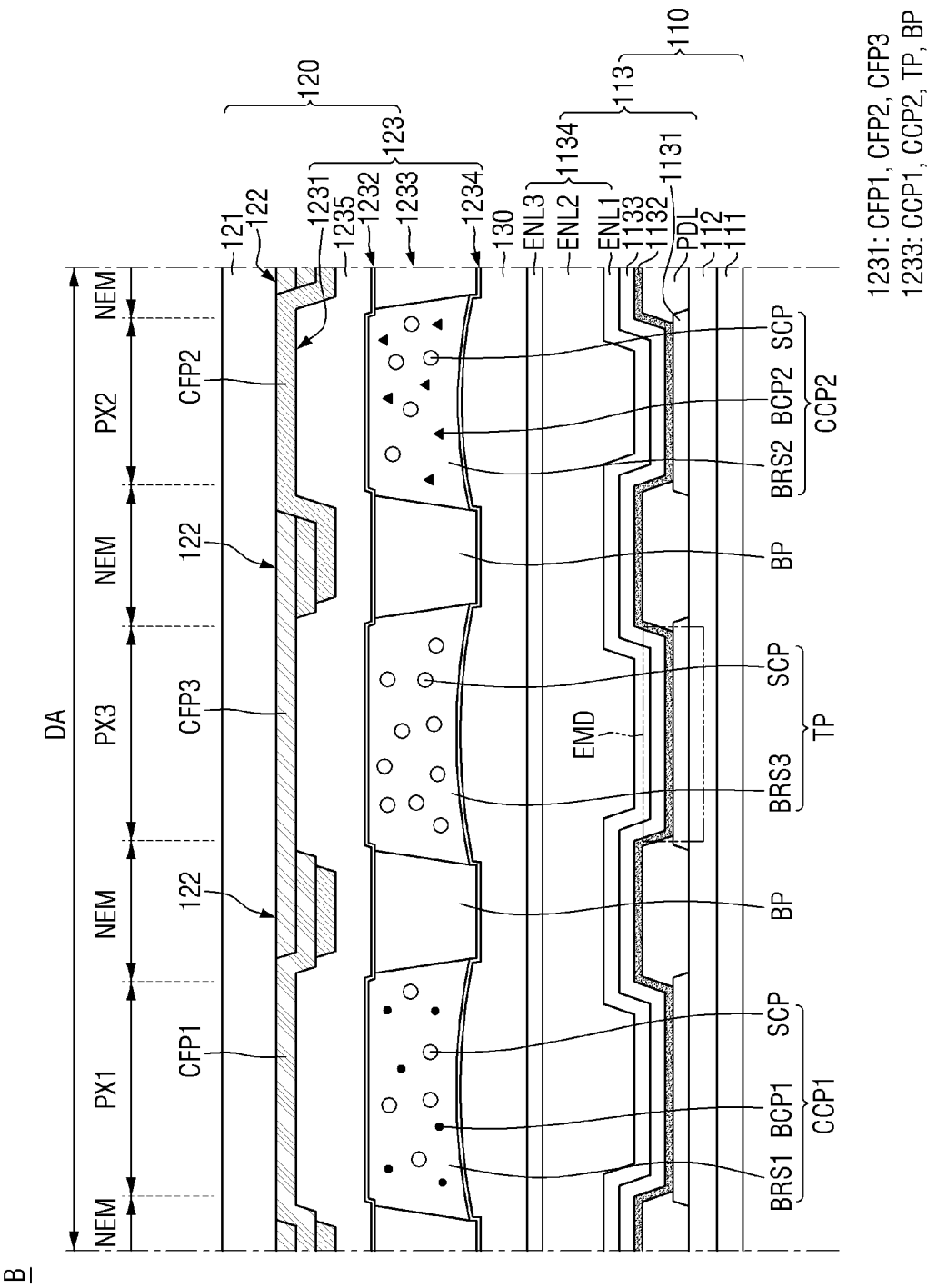
FIG. 3 is an enlarged view of part B of FIG. 2.

FIG. 3 is an enlarged view of part B of FIG. 2.

FIG. 3 shows first, second and third pixel areas PX1, PX2 and PX3 substantially continuous in one direction among the plurality of pixel areas PX included in the display panel 10. For example, the first, second, and third pixel areas PX1, PX2 and PX3 may be arranged with each other along the one direction, for example, with the non-emission area NEM between adjacent ones of the first, second, and third pixel areas PX1, PX2, and PX3.

Referring to FIG. 3, the non-emission area NEM is disposed at a boundary between the first, second and third pixel areas PX1, PX2 and PX3.

The first substrate 110 includes the first base substrate 111, the circuit array 112 on the first base substrate 111, and the light emitting array 113 on the circuit array 112.

The light emitting array 113 includes the light emitting element EMD corresponding to each of the first, second and third pixel areas PX1, PX2 and PX3.

The first base substrate 111 may be an insulating substrate. The first base substrate 111 may be formed of a transparent and/or hard material. For example, the first base substrate 111 may include (e.g., be) a transparent insulating material such as glass, quartz, and/or the like. However, this is only an example, and the first base substrate 111 may be formed of a flexible material, a conductive material, and/or an opaque material. For example, the first base substrate 111 may be formed of a plastic material having flexibility to be bent, folded, and/or rolled, such as polyimide.

A more detailed description of the circuit array 112 disposed on the first base substrate 111 will be given later with reference to FIGS. 4 and 5.

The light emitting array 113 includes a pixel electrode 1131 disposed on the circuit array 112 and corresponding to each of the first, second and third pixel areas PX1, PX2 and PX3, a pixel defining layer PDL covering the boundary of each of the plurality of pixel electrodes 1131, a light emitting layer 1132 disposed on the plurality of pixel electrodes 1131, and a common electrode 1133 disposed on the light emitting layer 1132. Here, the light emitting element EMD has a structure in which the pixel electrode 1131 and the common electrode 1133 overlap (e.g., face) each other with the light emitting layer 1132 interposed therebetween.

In some embodiments, the light emitting array 113 further includes an encapsulating structure 1134 for encapsulating the light emitting layer 1132.

The pixel electrode 1131 may be a first electrode (e.g., an anode electrode) of the light emitting element EMD. The pixel electrode 1131 may have a structure in which a material layer having a low work function and a reflective material layer are stacked. Here, a material layer having a high work function may be disposed closer to the light emitting layer 1132 than the reflective material layer is disposed to the light emitting layer 1132.

The material layer having a high work function may be formed of at least one selected from the group consisting of indium tin oxide (ITO), indium zinc oxide (IZO), zinc oxide (ZnO), and indium oxide ($In_2O_3$).

The reflective material layer may be formed of at least one selected from the group consisting of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), and a mixture thereof.

For example, the pixel electrode 1131 may have a multilayer structure such as ITO/Mg, ITO/MgF, ITO/Ag and ITO/Ag/ITO.

The pixel defining layer PDL may correspond to (e.g., may be at) the non-emission area NEM, which is a boundary between the plurality of pixel areas PX in the display area DA. The pixel defining layer PDL may be disposed on the circuit array 112 and cover the edge of each of the plurality of pixel electrodes 1131. For example, the pixel defining layer PDL has an opening exposing (e.g., exposing a center portion of) each of the pixel electrodes 1131. As described above, each pixel area PX may be divided by the pixel defining layer PDL having an opening corresponding to each pixel area PX. In some embodiments, the pixel areas PX may be divided by (e.g., separated or spaced apart in the plan view by) the non-emission area NEM and/or by the pixel defining layer PDL.

The pixel defining layer PDL may be formed of an insulating material. For example, the pixel defining layer PDL may include (e.g., be) at least one organic insulating material of acrylic resin, epoxy resin, phenolic resin, polyamide resin, polyimide resin, unsaturated polyester resin, polyphenylene ether resin, polyphenylenesulfide resin, or benzocyclobutene (BCB). In some embodiments, the pixel defining layer PDL may be formed of an inorganic insulating material.

The light emitting layer 1132 is disposed on the plurality of pixel electrodes 1131.

As illustrated in FIG. 3, the light emitting layer 1132 may be disposed to correspond to the plurality of pixel areas PX and may cover the plurality of pixel electrodes 1131 and the pixel defining layer PDL. In some embodiments, the light emitting layer 1132 may be disposed on each pixel electrode 1131 exposed through the opening of the pixel defining layer PDL.

The light emitting layer 1132 may be formed of an organic light emitting material. In this case, the light emitting layer 1132 may be a structure including a photoelectric conversion layer, and a hole transport layer and an electron transport layer disposed on both (e.g., simultaneously) sides of the photoelectric conversion layer. For example, the hole transport layer may be on one side of the photoelectric conversion layer, and the electron transport layer may be on another side of the photoelectric conversion layer. In some embodiments, the light emitting layer 1132 formed of an organic light emitting material may further include a hole injection layer disposed between the hole transport layer and the pixel electrode 1131, or an electron injection layer disposed between the electron transport layer and a common electrode 1133.

In some embodiments, the light emitting layer 1132 formed of an organic light emitting material may be formed in a tandem structure including a plurality of stacks which each include the photoelectric conversion layer and a charge generating layer disposed between the plurality of stacks. In this case, the plurality of stacks may include photoelectric conversion layers to emit light of the same wavelength region (e.g., wavelength range). On the other hand, the plurality of stacks may include photoelectric conversion layers to emit light of different wavelength regions.

In some embodiments, when the display device 1 is a micro LED display device or a nano LED display device, the light emitting layer 1132 may include (e.g., be) an inorganic semiconductor.

The common electrode 1133 may correspond to the plurality of pixel areas PX and may be disposed on the light emitting layer 1132. For example, the common electrode 1133 overlaps (e.g., faces) the pixel electrode 1131 with the light emitting layer 1132 interposed therebetween.

The common electrode 1133 may be a second electrode (e.g., a cathode electrode) of the light emitting element EMD.

The common electrode 1133 may include (e.g., be) a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg).

In some embodiments, the common electrode 1133 may further include a transparent metal oxide layer disposed on the material layer having a low work function.

The encapsulating structure 1134 may have a structure in which a plurality of encapsulation layers ENL1, ENL2 and ENL3 are stacked.

For example, the encapsulating structure 1134 may have a structure in which two or more inorganic insulating encapsulation layers ENL1 and ENL3 formed of an inorganic insulating material and at least one organic insulating encapsulation layer ENL2 formed of an organic insulating material are alternately stacked.

Each of the two or more inorganic insulating encapsulation layers ENL1 and ENL3 may be formed of silicon nitride, silicon oxide, and/or silicon oxynitride.

The at least one organic insulating encapsulation layer ENL2 may include (e.g., be) crylic resin, epoxy resin, phenolic resin, polyamide resin, polyimide resin, unsaturated polyester resin, polyphenylene ether resin, polyphenylenesulfide resin and/or benzocyclobutene (BCB).

The second substrate 120 includes the second base substrate 121 overlapping (e.g., facing) the first base substrate 111, the light blocking structure 122 disposed in the non-emission area NEM of the second base substrate 121, and the color array 123 disposed on the second base substrate 121.

The color array 123 may include a color filter layer 1231 disposed in the plurality of pixel areas PX on the second base substrate 121 and a first capping layer 1232 covering the light blocking structure 122 and the color filter layer 1231.

In some embodiments, the color array 123 may further include a color conversion layer 1233 disposed on the first capping layer 1232, a second capping layer 1234 covering the color conversion layer 1233, and a low refractive layer 1235 disposed between the color filter layer 1231 and the color conversion layer 1233 and formed of a material having a lower refractive index than the color conversion layer 1233.

As illustrated in FIG. 3, the low refractive layer 1235 may be disposed between the color filter layer 1231 and the first capping layer 1232.

Similarly to the first base substrate 111, the second base substrate 121 may be formed of a transparent and/or hard insulating material. For example, the second base substrate 121 may be formed of glass, quartz, and/or the like. The first and second base substrates 111 and 121 may be the same, or different, in material.

In some embodiments, the second base substrate 121 may be formed of a transparent and/or flexible insulating material. For example, the second base substrate 121 may be formed of a plastic material having flexibility to be bent, folded, and/or rolled, such as polyimide.

The second base substrate 121 may be formed of the same material as the first base substrate 111. In some embodiments, the second base substrate 121 may have a material, thickness, and/or transmittance different from those of the first base substrate 111.

The light blocking structure 122 is for blocking the light leakage from the non-emission area NEM except each pixel area PX and the non-display area NDA.

As illustrated in FIG. 3, the light blocking structure 122 may have a structure in which two or more color filter patterns CFP1, CFP2, and CFP3 that transmit light of different wavelength regions are stacked.

In some embodiments, the light blocking structure 122 may be formed of a light absorbing material that absorbs light in a visible wavelength band, such as a black matrix.

The color filter layer 1231 is for adjusting the color of light emitted from each pixel area PX.

Each of the plurality of pixel areas PX may correspond to any one of first, second and third colors different from each other. In this case, a unit pixel area, which is a reference for displaying one or more suitable colors, may be implemented as first, second and third pixel areas PX1, PX2 and PX3 that correspond to two or more different colors among the plurality of pixel areas PX and are substantially continuous with each other. For example, a unit pixel area may include one first pixel area PX1, one second pixel area PX2, and one third pixel area PX3. In some other embodiments, the pixel unit area includes one first pixel area PX1, two second pixel areas PX2, and one third pixel area PX3.

Referring to FIG. 3, the first, second and third pixel areas PX1, PX2 and PX3 substantially continuous with each other in any one direction may correspond to the first, second and third colors different from each other, respectively. For example, the first pixel area PX1 may be to emit light of a wavelength region corresponding to the first color, the second pixel area PX2 may be to emit light of a wavelength region corresponding to the second color, and the third pixel area PX3 may be to emit light of a wavelength region corresponding to the third color.

For example, the first, second and third colors may include red, green and blue. In some examples, the first color may be red, the second color may be green, and the third color may be blue.

The color filter layer 1231 includes a first color filter pattern CFP1 that transmits light of a first color, a second color filter pattern CFP2 that transmits light of a second color, and a third color filter pattern CFP3 that transmits light of a third color.

The first color filter pattern CFP1 is disposed in the first pixel area PX1 corresponding to the first color among the plurality of pixel areas PX.

The second color filter pattern CFP2 is disposed in the second pixel area PX2 corresponding to the second color among the plurality of pixel areas PX.

The third color filter pattern CFP3 is disposed in the third pixel area PX3 corresponding to the third color among the plurality of pixel areas PX.

Each of the first, second, and third color filter patterns CFP1, CFP2 and CFP3 may include (e.g., be) a colorant such as a dye and/or a pigment that is to absorb light in the wavelength region other than the wavelength region of the corresponding color.

For example, the first color filter pattern CFP1 may include (e.g., be) a colorant that is to absorb light in the wavelength region other than the wavelength region corresponding to the first color, and may be to transmit light in the wavelength region corresponding to the first color.

The second color filter pattern CFP2 may include (e.g., be) a colorant that is to absorb light in the wavelength region other than the wavelength region corresponding to the second color, and may be to transmit light in the wavelength region corresponding to the second color.

The third color filter pattern CFP3 may include (e.g., be) a colorant that is to absorb light in the wavelength region other than the wavelength region corresponding to the third color, and may be to transmit light in the wavelength region corresponding to the third color.

The low refractive layer 1235 is disposed in a path through which light of the color conversion layer 1233 is emitted, and is formed of a material having a lower refractive index than that of the color conversion layer 1233. For example, the low refractive layer 1235 may be formed of an organic material having a refractive index of about 1.1 or more and of about 1.4 or less. In some embodiments, the low refractive layer 1235 may further include particles dispersed in an organic material.

The low refractive layer 1235 is to return a part of the light that is emitted from the color conversion layer 1233 toward the second base substrate 121 back toward the color conversion layer 1233. Accordingly, because a part of the light is recycled by the low refractive layer 1235, light utilization efficiency may be improved, and the light efficiency of the display panel 10 may be improved.

The low refractive layer 1235 may be disposed between the color filter layer 1231 and the color conversion layer 1233. However, when the low refractive layer 1235 is interposed between the color filter layer 1231 and the first capping layer 1232 as illustrated in FIG. 3, there is an advantage of preventing or reducing a damage or contamination of the low refractive layer 1235 by (e.g., via) the first capping layer 1232. For example, the first capping layer 1232 may block foreign substances from penetrating into the low refractive layer 1235.

The first capping layer 1232 covers the color filter layer 1231 and the light blocking structure 122. In some embodiments, when the low refractive layer 1235 is interposed between the color filter layer 1231 and the first capping layer 1232, the first capping layer 1232 further covers the low refractive layer 1235.

The first capping layer 1232 may be formed of an inorganic material. For example, the first capping layer 1232 may contain at least one of silicon nitride, aluminum nitride, zirconium nitride, titanium nitride, hafnium nitride, tantalum nitride, silicon oxide, aluminum oxide, titanium oxide, tin oxide, or silicon oxynitride.

The first capping layer 1232 protects the color filter layer 1231 and the low refractive layer 1235 from being damaged or contaminated by impurities such as moisture and/or air permeating from the outside.

In some embodiments, the first capping layer 1232 may prevent or block the colorant of the color filter layer 1231 from being diffused to other layers.

The color conversion layer 1233 is disposed on the first capping layer 1232.

The color conversion layer 1233 is to convert the light of the light emitting element EMD into a different color, and emitting the light through each pixel area PX when the plurality of light emitting elements EMD included in the light emitting array 113 emit a single color.

Hereinafter, a case in which the plurality of light emitting elements EMD corresponding to the plurality of pixel areas PX emit light of the third color will be described as an example. However, the present disclosure is not limited thereto. In some embodiments, when the light emitting element EMD corresponding to each pixel area PX emits light of a color corresponding to each pixel area PX, the display panel 10 may not include (e.g., may exclude) the color conversion layer 1233.

The color conversion layer 1233 may include a bank pattern BP disposed in the non-display area NDA and the non-emission area NEM, a first color conversion pattern CCP1 corresponding to the first color filter pattern CFP1 and to convert light of the third color emitted from the light emitting element EMD to light of the first color, a second color conversion pattern CCP2 corresponding to the second color filter pattern CFP2 and to convert light of the third color emitted from the light emitting element EMD to light of the second color, and a transmitting pattern TP corresponding to the third color filter pattern CFP3 and to transmit light of the third color emitted from the light emitting element EMD.

The bank pattern BP is disposed in the non-display area NDA and the non-emission area NEM except for the plurality of pixel areas PX in the display area DA. The bank pattern BP may be formed of a light blocking material that blocks a visible light wavelength band (e.g., part or all of the visible wavelength range). For example, the bank pattern BP may include (e.g., be) an organic light blocking material.

A region from which light is emitted may be limited to each pixel region PX by the bank pattern BP. Accordingly, color mixing between adjacent pixel areas PX may be prevented or reduced.

Like the first color filter pattern CFP1, the first color conversion pattern CCP1 corresponds to pixel areas corresponding to the first color among the plurality of pixel areas PX.

The first color conversion pattern CCP1 may include (e.g., be) a first base resin BRS1 and first wavelength conversion particles BCP1 dispersed in the first base resin BRS1. The first wavelength conversion particles BCP1 may be formed of a material that converts light of the third color to light of the first color.

The first color conversion pattern CCP1 converts light of the third color into a wavelength region corresponding to the first color.

Like the second color filter pattern CFP2, the second color conversion pattern CCP2 corresponds to pixel areas corresponding to the second color among the plurality of pixel areas PX.

The second color conversion pattern CCP2 may include (e.g., be) a second base resin BRS2 and second wavelength conversion particles BCP2 dispersed in the second base resin BRS2. The second wavelength conversion particles BCP2 may be formed of a material that converts light of the third color into light of the second color.

The second color conversion pattern CCP2 converts light of the third color into a wavelength region corresponding to the second color.

Like the third color filter pattern CFP3, the transmitting pattern TP corresponds to pixel areas PX corresponding to the third color among the plurality of pixel areas PX.

The transmitting pattern TP includes (e.g., is) a third base resin BRS3 and scattering particles SCP dispersed in the third base resin BRS3 to diffuse and transmit light.

The scattering particles SCP may be formed of metal oxide particles and/or organic particles.

Examples of the metal oxide particles may include (e.g., be) titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like.

Examples of the organic particles may include (e.g., be) an acrylic resin, a urethane resin, and/or the like.

Each of the first, second, and third base resins BRS1, BRS2 and BRS3 may be formed of a light transmitting organic material. Examples of the light transmitting organic material may include (e.g., be) an epoxy resin, an acrylic resin, a cardo resin, an imide resin, and/or the like.

The first, second and third base resins BRS1, BRS2 and BRS3 may be formed of the same material, but are not limited thereto.

Each of the first wavelength conversion particles BCP1 and the second wavelength conversion particles BCP2 may be at least one of a quantum dot, a quantum rod or a phosphor.

The quantum dot may be any one selected from group IV nanocrystals, group II-VI compound nanocrystals, group III-V compound nanocrystals, group IV-VI nanocrystals, and combinations thereof.

Like the transmitting pattern TP, the first and second color conversion patterns CCP1 and CCP2 may further include scattering particles SCP.

The second capping layer 1234 covers the color conversion layer 1233 including the first and second color conversion patterns CCP1 and CCP2, the transmitting pattern TP and the bank pattern BP.

The second capping layer 1234 may be formed of an inorganic material. For example, the second capping layer 1234 may contain at least one of silicon nitride, aluminum nitride, zirconium nitride, titanium nitride, hafnium nitride, tantalum nitride, silicon oxide, aluminum oxide, titanium oxide, tin oxide, or silicon oxynitride.

In the display area DA, the gap between the first and second substrates 110 is filled by the filling layer 130.

A physical impact in the gap between the first and second substrates 110 and 120 may be alleviated by the filling layer 130.

Next, a circuit array will be described with reference to FIGS. 4, 5 and 6.

Figure 4:
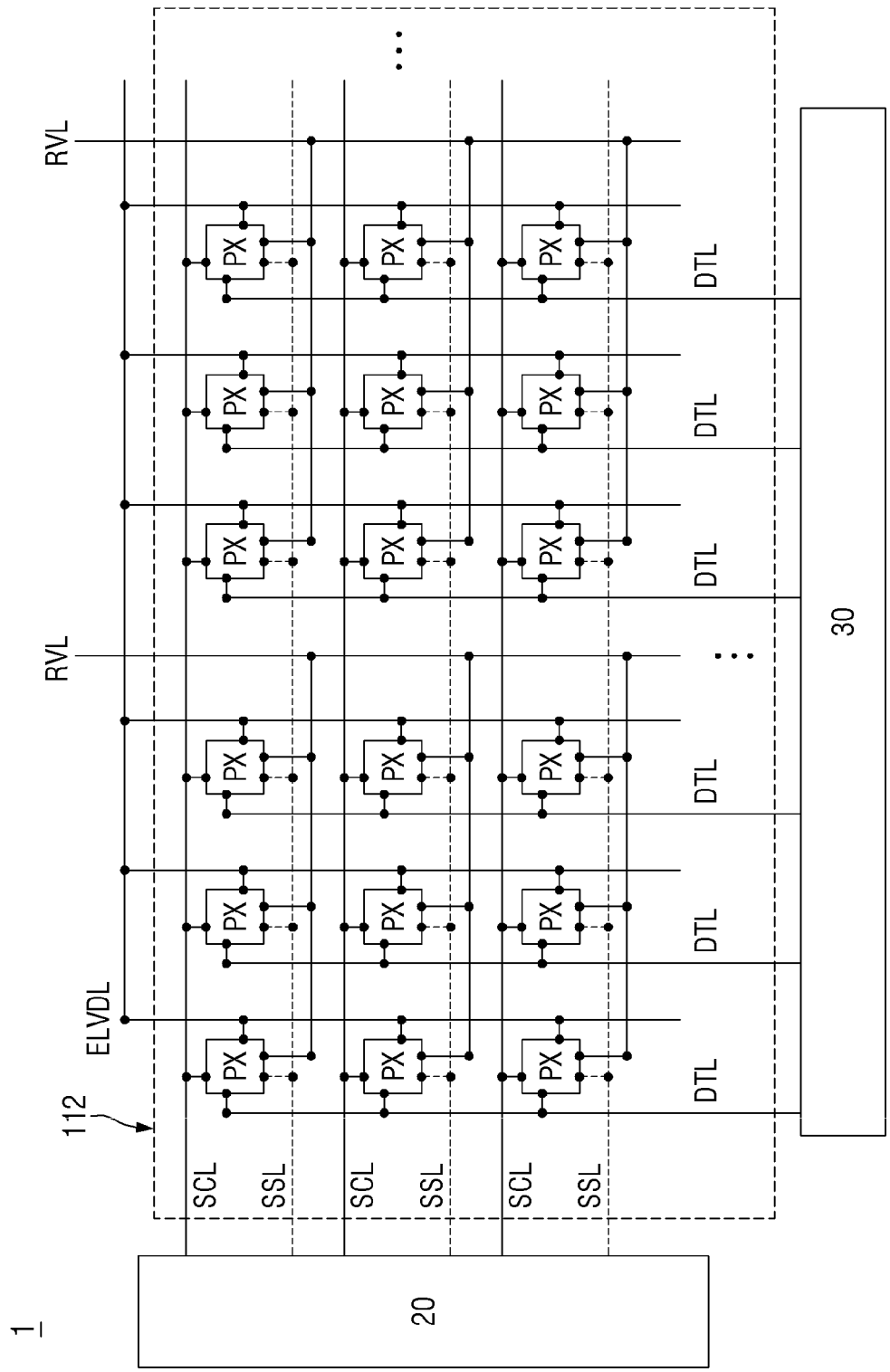
FIG. 4 is a schematic layout diagram of the circuit array of FIG. 3.

FIG. 4 is a schematic layout diagram of the circuit array of FIG. 3. FIG. 5 is an equivalent circuit diagram of the pixel area of FIG. 4. FIG. 6 is a cross-sectional view of a driving thin film transistor and the light emitting element of FIG. 5.

Referring to FIG. 4, a circuit array (112 in FIG. 2) of the first substrate 110 includes wires supplying a signal or power to the plurality of pixel areas PX.

The circuit array 112 may include a scan line SCL and a sensing signal line SSL extending in the first direction (left-right direction in FIG. 4) in the display area DA, and a data line DTL, a reference voltage line RVL and a first power line ELVDL disposed in the second direction (top-bottom direction in FIG. 4) crossing the first direction in the display area DA.

The scan line SCL supplies a scan signal for selecting a horizontal line to record a data signal.

The sensing signal line SSL supplies a sensing signal for selecting a horizontal line to execute sensing.

The data line DTL supplies a data signal corresponding to luminance of each pixel area PX.

The reference voltage line RVL supplies a reference voltage for data reset of each pixel area PX.

The first power line ELVDL supplies a first power for driving the light emitting element EMD.

The scan line SCL and the sensing signal line SSL are coupled (e.g., connected) to the scan driver 20.

The scan driver 20 sequentially supplies scan signals to the plurality of scan lines SCL during one frame period for image display.

In some embodiments, the scan driver 20 sequentially supplies the sensing signals to the plurality of sensing signal lines SSL during the sensing period.

Because the scan driver 20 is formed of a relatively simple circuit, it may be embedded in the display panel 10. In one example, the scan driver 20 may be disposed on one side of the non-display area NDA of the first base substrate 111 in the first direction.

The data line DTL and the reference voltage line RVL are coupled (e.g., connected) to the data driver 30.

The data driver 30 supplies data signals of the pixel areas PX included in each horizontal line to the data line DTL during each horizontal period corresponding to each horizontal line during one frame period.

The data driver 30 may be implemented as an integrated circuit chip embedded in the display panel 10 or a circuit board (31 in FIG. 1) coupled (e.g., connected) to the display panel 10.

Each pixel area PX includes a pixel driving circuit generating a driving signal of the light emitting element EMD based on the signals and voltages supplied through the wires. The pixel driving circuit may include at least one transistor and a capacitor coupled (e.g., connected) to the wires.

Hereinafter, a pixel driving circuit of a 3T1C structure including three transistors and one capacitor will be described with reference to FIG. 5. However, the present disclosure is not limited to the 3T1C pixel driving circuit, and may include pixel driving circuits having one or more suitable structures.

Figure 5:
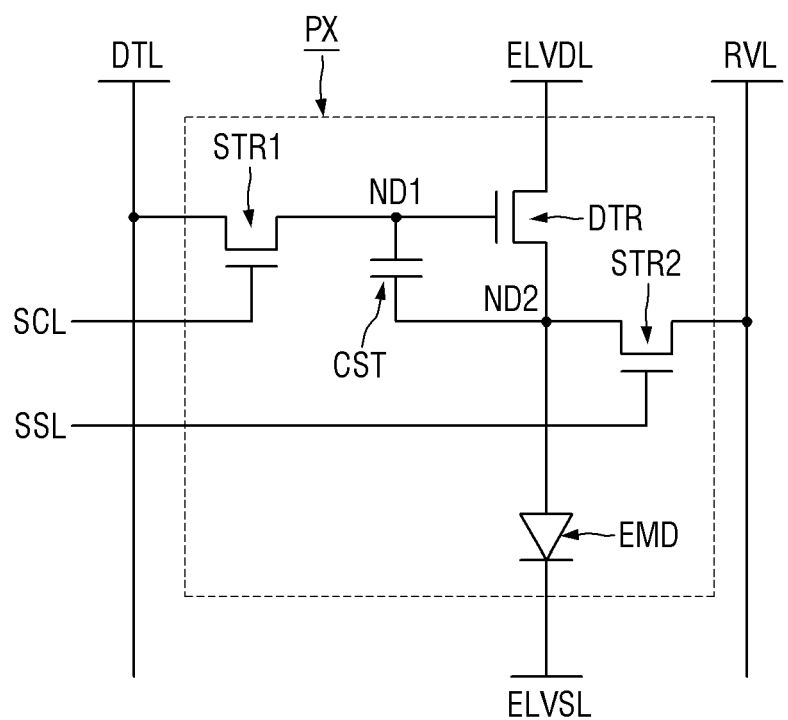
FIG. 5 is an equivalent circuit diagram of the pixel area of FIG. 4.

Referring to FIG. 5, each pixel area PX may include a pixel driving circuit having a 3T1C structure including a light emitting element EMD, a driving transistor DTR, a storage capacitor CST, a first switching transistor STR1 and a second switching transistor STR2.

The light emitting element EMD may be implemented as an organic light emitting diode, a micro light emitting diode, a nano light emitting diode, and/or the like.

The driving transistor DTR is coupled (e.g., connected) in series with the light emitting element EMD between the first power line ELVDL and a second power line ELVSL.

The second power line ELVSL supplies a second power voltage lower than a first power voltage of the first power line ELVDL.

For example, the drain electrode of the driving transistor DTR may be coupled (e.g., connected) to the first power line ELVDL, and the source electrode of the driving transistor DTR may be coupled (e.g., connected) to the first electrode (e.g., anode electrode) of the light emitting element EMD.

In some embodiments, the second electrode (e.g., cathode electrode) of the light emitting element EMD may be coupled (e.g., connected) to the second power line ELVSL.

The driving transistor DTR may generate a driving current flowing between the first and second power lines ELVDL and ELVSL based on the voltage difference between the gate electrode and the source electrode. The light emitting element EMD emits light having a luminance corresponding to a driving current of the driving transistor DTR.

The storage capacitor CST is disposed between a first node ND1 and a second node ND2. The first node ND1 is a contact point coupled (e.g., connected) to the gate electrode of the driving transistor DTR. The second node ND2 is a contact point between the driving transistor DTR and the light emitting element EMD. The storage capacitor CST stores a voltage difference between the gate electrode and the source electrode of the driving transistor DTR.

The first switching transistor STR1 is coupled (e.g., connected) between the data line DTL and the first node ND1 and is turned on based on a scan signal of the scan line SCL. When the first switching transistor STR1 is turned on, the data signal of the data line DTL is supplied to the first node ND1, for example, the gate electrode of the driving transistor DTR and the storage capacitor CST.

The second switching transistor STR2 is coupled (e.g., connected) between the second node ND2 and the reference voltage line RVL and is turned on based on a sensing signal of the sensing signal line SSL. When the second switching transistor STR2 is turned on, the reference voltage of the reference voltage line RVL may be supplied to the second node ND2 to initialize a voltage difference between the gate electrode and the source electrode of the driving transistor DTR. In some embodiments, the voltage of the second node ND2 may be transferred to the reference voltage line RVL through the second switching transistor STR2 to collect a signal related to the deterioration state of the driving transistor DTR.

The driving transistor DTR and the first and second switching transistors STR1 and STR2 are N-type or kind MOSFETs (metal oxide semiconductor field effect transistors) in FIG. 5, but this is only an example. For example, the driving transistor DTR and the first and second switching transistors STR1 and STR2 may be P-type or kind MOSFETs, or a part (e.g., one or more) of the driving transistor DTR and the first and second switching transistors STR1 and STR2 may be an N-type or kind MOSFET and the other part (e.g., the remaining one or more) thereof may be a P-type or kind MOSFET.

Figure 6:
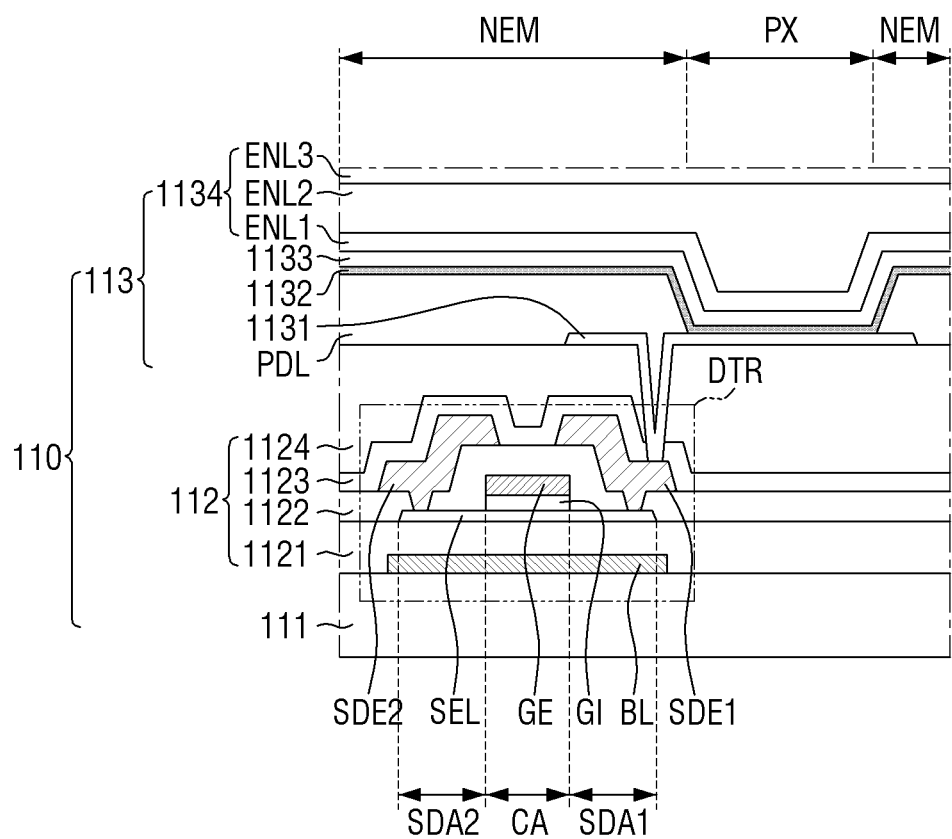
FIG. 6 is a cross-sectional view of a driving thin film transistor and the light emitting element of FIG. 5.

Referring to FIG. 6, the driving transistor DTR of each pixel area PX includes a semiconductor layer SEL including a channel area CA and a source area SDA1 and a drain area SDA2 spaced apart from each other with the channel area CA interposed therebetween, a gate electrode GE overlapping the channel area CA of the semiconductor layer SEL, a source electrode SDE1 coupled (e.g., connected) to the source area SDA1 of the semiconductor layer SEL and a drain electrode SDE2 coupled (e.g., connected) to the drain area SDA2 of the semiconductor layer SEL.

In some embodiments, the circuit array 112 of the first substrate 110 may include a barrier layer BL disposed on the first base substrate 111 to overlap the semiconductor layer SEL of each pixel area PX, a buffer layer 1121 covering the barrier layer BL, the semiconductor layer SEL disposed on the buffer layer 1121, a gate insulating layer GI covering the channel area CA of the semiconductor layer SEL, a gate electrode GE disposed on the gate insulating layer GI, an interlayer insulating layer 1122 covering the semiconductor layer SEL and the gate electrode GE, the source electrode SDE1 and the drain electrode SDE2 disposed on the interlayer insulating layer 1122, an auxiliary interlayer insulating layer 1123 covering the source electrode SDE1 and the drain electrode SDE2 and a via layer 1124 covering the auxiliary interlayer insulating layer 1123.

The barrier layer BL is for protecting the semiconductor layer SEL from external light. The barrier layer BL may overlap at least the channel area CA of the semiconductor layer SEL. In some embodiments, the barrier layer BL may overlap the entire semiconductor layer SEL. Because at least the channel area CA of the semiconductor layer SEL can be protected from the external light by the barrier layer BL, the threshold voltage characteristic of the semiconductor layer SEL can be prevented from being changed by the external light, or such change can be reduced.

The buffer layer 1121 may be disposed entirely on one surface (e.g., the top surface) of the first base substrate 111 and cover the barrier layer BL. The buffer layer 1121 may be formed of a single layer or multiple layers of at least one of silicon nitride, silicon oxide, or silicon oxynitride.

The semiconductor layer SEL may be disposed on the buffer layer 1121 and overlap the barrier layer BL. For example, the semiconductor layer SEL may be formed of an oxide semiconductor. The oxide semiconductor may include (e.g., be) at least one of a binary compound (ABx), a ternary compound (ABxCy), or a quaternary compound (ABxCyDz) including (e.g., being) indium, zinc, gallium, tin, titanium, aluminum, hafnium (Hf), zirconium (Zr), magnesium (Mg) and/or the like.

When the semiconductor layer SEL is formed of an oxide semiconductor, at least a portion of each of the source area SDA1 and the drain area SDA2 except the channel area CA of the semiconductor layer SEL may be made conductive.

The gate insulating layer GI may be patterned together with the gate electrode GE to be disposed below the gate electrode GE.

The gate insulating layer GI may include (e.g., be) a silicon compound, a metal oxide, and/or the like. For example, the gate insulating layer GI may include (e.g., be) silicon oxide, silicon nitride, silicon oxynitride, aluminum oxide, tantalum oxide, hafnium oxide, zirconium oxide, titanium oxide, and/or the like.

The gate electrode GE overlaps the channel area CA of the semiconductor layer SEL with the gate insulating layer GI interposed therebetween.

For example, the gate electrode GE may have a multilayer structure including a bottom layer relatively adjacent to (e.g., proximal to) the first base substrate 111 and a top layer relatively distant from (e.g., distal to) the first base substrate 111. The bottom layer may enhance film formation property of the top layer and block or reduce a reactive material entering from the gate insulating layer GI. In some embodiments, the bottom layer may prevent or block the material forming the top layer from being diffused into the semiconductor layer SEL. The top layer may be formed of a low resistance material in consideration of wiring resistance. In some examples, the bottom layer may be formed of titanium (Ti) and the top layer may be formed of copper (Co).

The interlayer insulating layer 1122 is disposed entirely over the buffer layer 1121 and covers the semiconductor layer SEL and the gate electrode GE.

The interlayer insulating layer 1122 may be formed of an inorganic insulating material such as silicon oxide, silicon nitride, silicon oxynitride, hafnium oxide, aluminum oxide, titanium oxide, tantalum oxide, zinc oxide and/or the like.

A portion of each of the source area SDA1 and the drain area SDA2 of the semiconductor layer SEL is exposed through a hole penetrating the interlayer insulating layer 1122.

The source electrode SDE1 and the drain electrode SDE2 are disposed in the interlayer insulating layer 1122 and coupled (e.g., connected) to the semiconductor layer SEL through the holes penetrating the interlayer insulating layer 1122 to expose the source and drain areas SDA1 and SDA2, respectively.

The auxiliary interlayer insulating layer 1123 may be disposed entirely over the interlayer insulating layer 1122 and covers the source electrode SDE1 and the drain electrode SDE2.

Like the interlayer insulating layer 1122, the auxiliary interlayer insulating layer 1123 may be formed of an inorganic insulating material such as silicon oxide, silicon nitride, silicon oxynitride, hafnium oxide, aluminum oxide, titanium oxide, tantalum oxide, and/or zinc oxide.

The via layer 1124 may be disposed entirely over the auxiliary interlayer insulating layer 1123.

The via layer 1124 may be formed to have a thickness enough to eliminate a stepped shape of the conductive patterns provided on the circuit array 112.

The via layer 1124 may include (e.g., be) an organic insulating material of acrylic resin, epoxy resin, phenolic resin, polyamide resin, polyimide resin, unsaturated polyester resin, polyphenylene resin, polyphenylenesulfide resin, and/or benzocyclobutene (BCB).

In some embodiments, the via layer 1124 may further include a photosensitive material.

A part of the source electrode SDE1 of the driving transistor DTR may correspond to a hole (e.g., overlap the hole in the plan view) penetrating the auxiliary interlayer insulating layer 1123 and the via layer 1124.

The light emitting array 113 is disposed on the via layer 1124.

For example, the light emitting array 113 includes the pixel electrode 1131 disposed on the via layer 1124 to correspond to each pixel area PX, the pixel defining layer PDL disposed on the via layer 1124 to correspond to the non-emission area NEM that may be the boundary of each pixel area PX and disposed to cover at least a portion (e.g., an edge) of the pixel electrode 1131, the light emitting layer 1132 disposed on the pixel electrode 1131, a common electrode 1133 disposed on the light emitting layer 1132 over the plurality of pixel areas PX, and the encapsulating structure 1134 disposed on the common electrode 1133 and having a structure in which two or more inorganic insulating encapsulation layers ENL1 and ENL3 and at least one organic insulating encapsulation layer ENL2 are alternately stacked.

The pixel electrode 1131 may be coupled (e.g., connected) to the source electrode SDE1 of the driving transistor DTR through the hole penetrating the auxiliary interlayer insulating layer 1123 and the via layer 1124.

The light emitting layer 1132 may be disposed to entirely cover the pixel electrode 1131 and the pixel defining layer PDL over the plurality of pixel areas PX. In some embodiments, the light emitting layer 1132 may correspond to each pixel area PX and be disposed on the pixel electrode 1131.

In some embodiments, the driving transistor DTR has a top gate structure in FIG. 6, but this is only an example, and the driving transistor DTR according to some embodiments may have a bottom gate structure, a double gate structure, and/or the like.

Next, a non-display area NDA of the display panel 10 according to some embodiments will be described with reference to FIG. 7.

Figure 7:
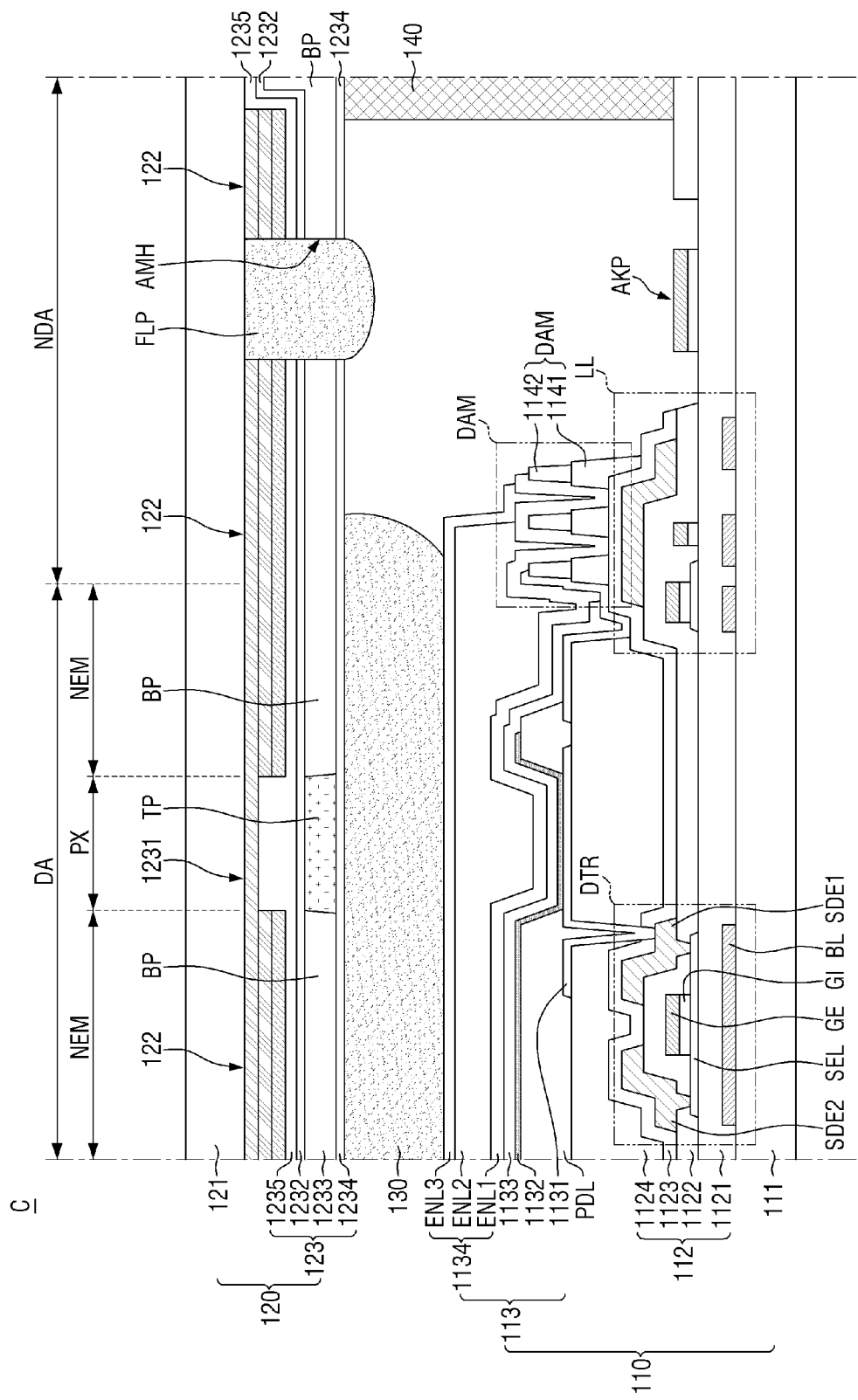
FIG. 7 is an enlarged view of part C of FIG. 2.

FIG. 7 is an enlarged view of part C of FIG. 2.

Referring to FIG. 7, the display panel 10 according to some embodiments may include the align key pattern AKP disposed in the non-display area NDA of the first base substrate 111, the align matching hole AMH penetrating the light blocking structure 122 disposed in the non-display area NDA of the second base substrate 121, and the filling pattern FLP filling the align matching hole AMH.

In some embodiments, the display panel 10 further includes the filling layer 130 to fill the gap between the first substrate 110 and the second substrate 120, and the sealing pattern 140 corresponding to any one edge of the first substrate 110 or the second substrate 120 and disposed between the first substrate 110 and the second substrate 120.

In some embodiments, the display panel 10 may further include one or more dam structures DAM disposed in a portion of the non-display area NDA of the first base substrate 111, which is adjacent to the display area DA. The one or more dam structures DAM may be at an edge of the display area DA and may be around (e.g., surround) at least a portion (e.g., all) of the display area DA.

Also, the display panel 10 may further include one or more suitable link lines LL disposed in the non-display area NDA.

The link line LL connects each of the wires (e.g., SCL, SSL, DTL, RVL, ELVDL and/or the like in FIG. 4) of the display area DA to the drivers (20 and 30 in FIG. 1). In order to be advantageous for integration, the link line LL may be formed of a combination of conductive layers different from each other.

For example, a part (e.g., some) of the link lines LL may connect the driver (20 in FIG. 1) embedded in the non-display area NDA to the wires (e.g., SCL and SSL in FIG. 4) of the display area DA. In some embodiments, the other part (e.g., the remaining) of the link lines LL may connect each of the pads of the non-display area NDA, to which the circuit board (31 in FIG. 1) on which the integrated circuit chip (30 in FIG. 1) of the driver is mounted is bonded, to the wires (e.g., RVL, DTL and ELVDL in FIG. 4) of the display area DA.

The one or more dam structures DAM may be disposed to be parallel (e.g., substantially parallel) to a portion of the non-display area NDA in contact with the edge of the display area DA. The one or more dam structures DAM may overlap the link line LL.

Each of the one or more dam structures DAM may have a structure in which a plurality of dam layers 1141 and 1142 are stacked.

For example, each of the one or more dam structures DAM may include a first dam layer 1141 having the same layer (e.g., including (e.g., being) a same material) as the via layer 1124, and a second dam layer 1142 having the same layer (e.g., including (e.g., being) a same material) as the pixel defining layer PDL.

Because the one or more dam structures DAM may generate a curvature at a periphery of the display area DA, the organic material deposited on the display area DA may be prevented or blocked from overflowing into the non-display area NDA. In some embodiments, because the path through which oxygen and/or moisture penetrates into the light emitting layer 1132 becomes complicated due to the curvature caused by the one or more dam structures DAM, the light emitting layer 1132 may be further protected from oxygen and/or moisture.

The encapsulating structure 1134 disposed on the common electrode 1133 may be expanded to a portion of the non-display area NDA to cover the top portion of the one or more dam structures DAM.

The align key pattern AKP is provided on the first substrate 110.

The align key pattern AKP is formed of an opaque material because it should be visually recognized from the outside of the display panel 10 in order to check the alignment state of the first and second substrates 110 and 120.

For example, as illustrated in FIG. 7, the align key pattern AKP may have the same layer (e.g., include (e.g., be) a same material) as the gate electrode GE of the driving transistor DTR. In some embodiments, the align key pattern AKP and the gate electrode GE may be formed from a same layer, and the align key pattern AKP may be the same in material as the gate electrode GE. However, this is only an example, and the align key pattern AKP may be disposed on the same layer as the source electrode and the drain electrode SDE1 and SDE2 of the driving transistor DTR. In some embodiments, the align key pattern AKP and the source electrode SDE1 and/or the drain electrode SDE2 may be formed from a same layer, and the align key pattern AKP may be the same in material as the source electrode SDE1 and/or the drain electrode SDE2. In some embodiments, the align key pattern AKP may be disposed on the same layer as the barrier layer BL. In some embodiments, the align key pattern AKP and the barrier layer BL may be formed from a same layer, and the align key pattern AKP may be the same in material as the barrier layer BL.

The align key pattern AKP may be formed as an island pattern spaced apart from other conductive patterns that may be around (e.g., surround) the align key pattern AKP in the plan view for visibility improvement.

For example, in the viewing direction (e.g., in the plan view) passing through the second base substrate 121 from the outside toward the first base substrate 111, the align key pattern AKP may be spaced apart from opaque patterns disposed on the same layer and different layers. In this way, the position and shape of the align key pattern AKP sensed in the viewing direction passing through the second base substrate 121 may be prevented from being deformed, or such deformation may be reduced.

In some embodiments, for visibility improvement, the align key pattern AKP may maintain the state of being exposed without being covered by the insulating layer.

For example, unlike the gate electrode GE of the driving transistor DTR which is covered by the insulating layers such as the interlayer insulating layer 1122, the auxiliary interlayer insulating layer 1123, the via layer 1124, the pixel defining layer PDL and the encapsulating structure 1134, the align key pattern AKP may not be covered by the insulating layers. In some embodiments, one or more (e.g., all) of these layers do not overlap the align key pattern AKP in the plan view. In this way, visibility deterioration of the align key pattern AKP due to the refractive indices of the insulating layers may be prevented or reduced when observing in the viewing direction passing through the second base substrate 121.

The align matching hole AMH is provided in the second substrate 120 and corresponds to the position and shape of the align key pattern AKP.

To expose a part of the non-display area NDA of the second base substrate 121 overlapping (e.g., facing) the align key pattern AKP, the align matching hole AMH may be a hole penetrating the light blocking structure 122 disposed in the non-display area NDA of the second base substrate 121.

For example, the light blocking structure 122 for light leakage prevention or reduction is disposed in the non-display area NDA of the second base substrate 121. Because the align key pattern AKP cannot be visually recognized from the outside of the second base substrate 121, the align matching hole AMH passing through a part of the light blocking structure 122 overlapping (e.g., facing) the align key pattern AKP needs to be disposed.

Accordingly, based on the overlapping shape between the align key pattern AKP and the align matching hole AMH, it may be checked whether the alignment state between the first substrate 110 and the second substrate 120 is normal or not. At this time, as the shape and size of the align matching hole AMH are becomes more similar to those of the align key pattern AKP, the errors of the alignment process may be reduced while the difficulty of the alignment process between the first and second substrates 110 and 120 increases.

As illustrated in FIG. 7, the low refractive layer 1235 disposed on the light blocking structure 122, the first capping layer 1232 disposed on the low refractive layer 1235, the bank pattern BP disposed on the first capping layer 1232, and the second capping layer 1234 disposed on the bank pattern BP may extend to the non-display area NDA to cover the light blocking structure 122 disposed on the non-display area NDA of the second base substrate 121. In this case, the align matching hole AMH may penetrate not only the light blocking structure 122 but also the low refractive layer 1235, the first capping layer 1232, the bank pattern BP and the second capping layer 1234 covering the light blocking structure 122.

Figure 8:
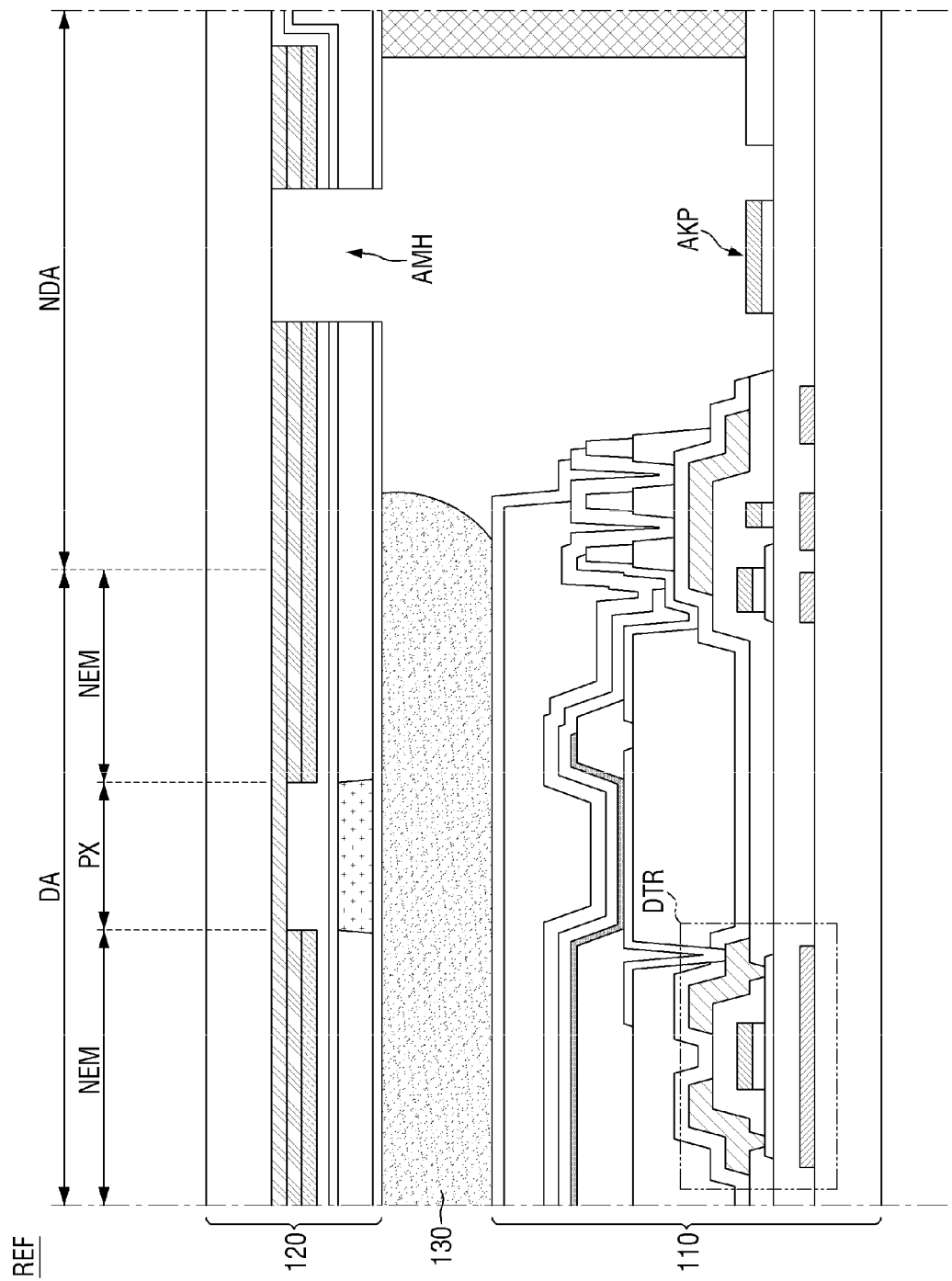
FIG. 8 is a cross-sectional view of a display panel according to a comparative example.

FIG. 8 is a cross-sectional view of a display panel according to a comparative example. FIGS. 9, 10, 11, 12 and 13 are examples of errors according to the comparative example of FIG. 8.

Unlike the embodiment, FIG. 8 shows a comparative example REF of a structure in which the filling pattern FLP is not included.

Referring to FIG. 8, the align matching hole AMH according to the comparative example REF may be maintained in a cavity state. Accordingly, foreign substances may easily be inserted into the align matching hole AMH. For example, a case where the filling layer 130 extends to the non-display area NDA and is inserted as foreign substances covering a part of the align matching hole AMH, a case where foreign substances such as bubbles are introduced together with the extended filling layer 130, and a case where foreign substances such as fragments of other components generated due to a physical impact are introduced may be expected.

In one example, due to a process error, the filling layer 130 may be formed of a filling material in an amount greater than a normal amount. In this case, the filling layer 130 may extend to the non-display area NDA to cover at least a part of the alignment hole AMH. Here, the normal amount of the filling material may correspond to a gap between the first and second substrates 110 and 120 and the width of the display area DA.

Figure 9:
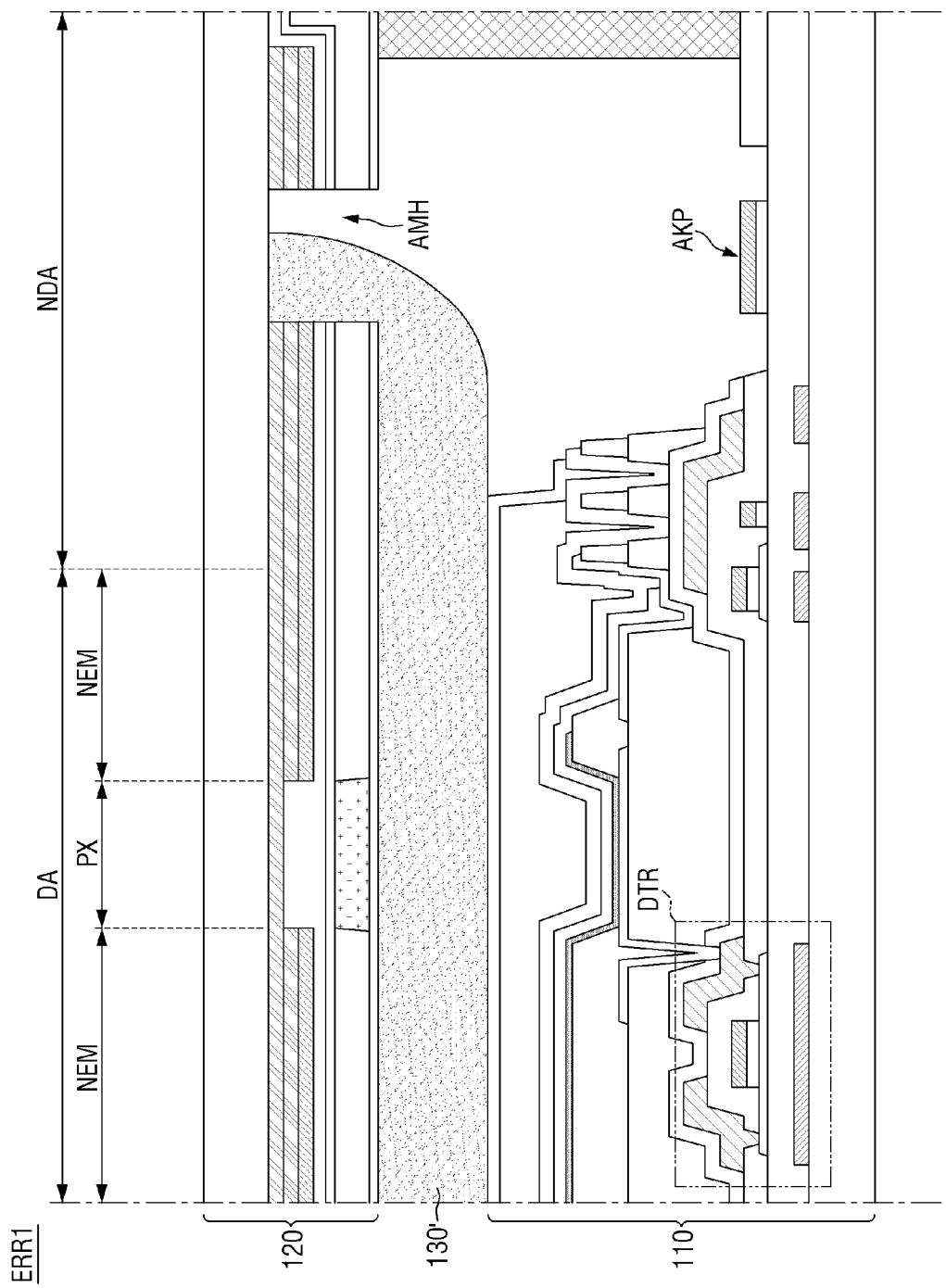
FIGS. 9, 10, 11, 12 and 13 are examples of errors according to the comparative example of FIG. 8.

Referring to FIG. 9, a portion of the align matching hole AMH may be invaded by the filling layer 130' due to the filling material in an amount greater than the normal amount.

Figure 10:
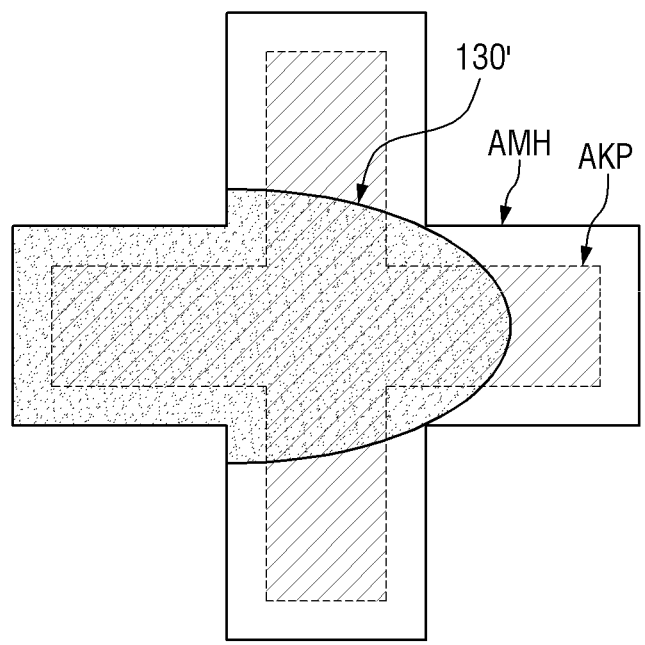

In this case, as illustrated in FIG. 10, as a part of the align matching hole AMH is filled with the filling layer 130', the boundary of the filling layer 130' which entered the align matching hole AMH may be reflected in a planar shape of the align matching hole AMH. Accordingly, the overlapping shape between the align matching hole AMH and the align key pattern AKP may be deformed.

Figure 11:
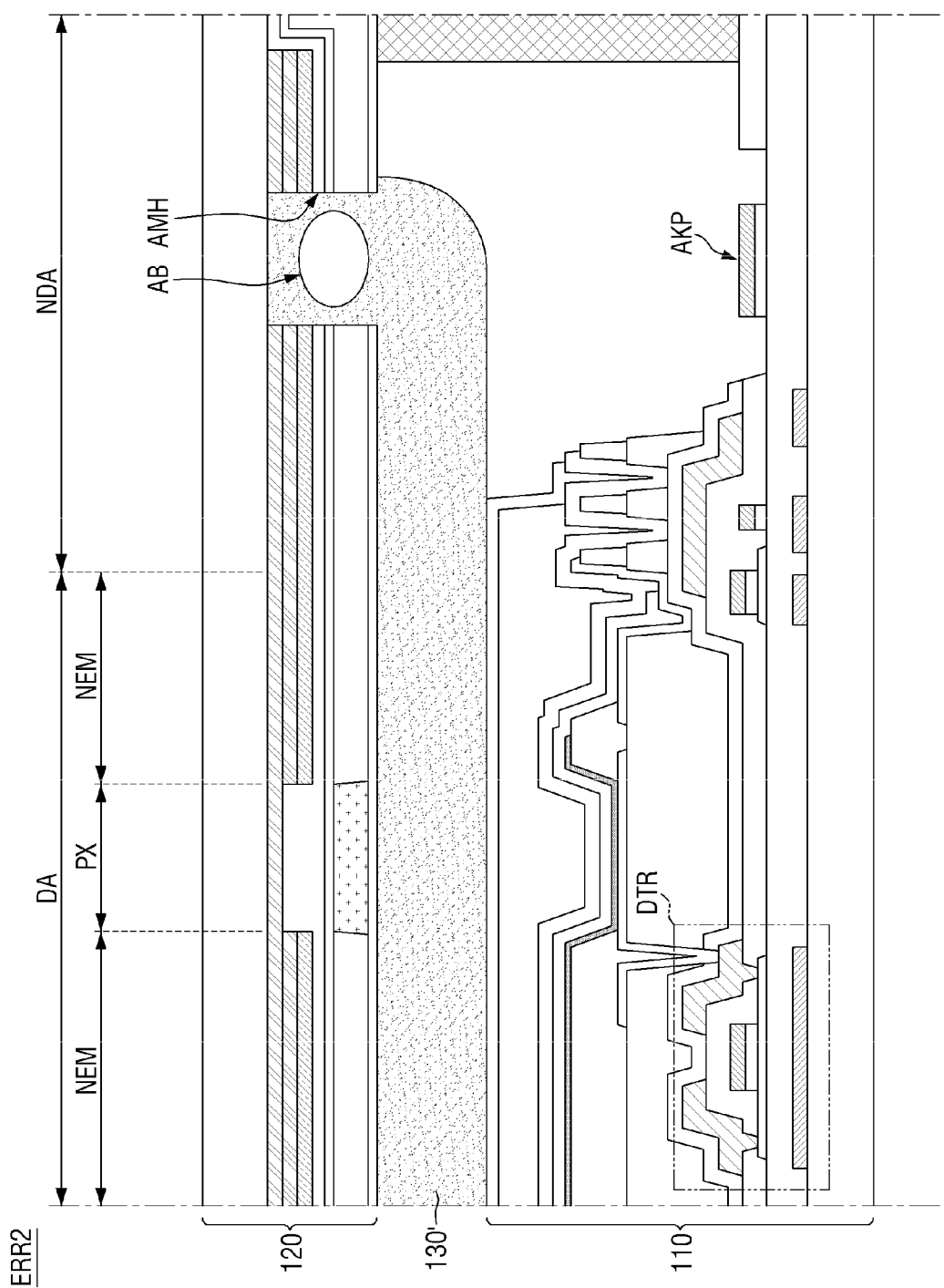

In some embodiments, as illustrated in FIG. 11, the filling layer 130' may invade the entire align matching hole AMH. At this time, because it is difficult to easily discharge air in the align matching hole AMH when the filling material is pushed into the align matching hole AMH, foreign substances of an air bubble AB may be inserted into or may enter into the align matching hole AMH.

Figure 12:
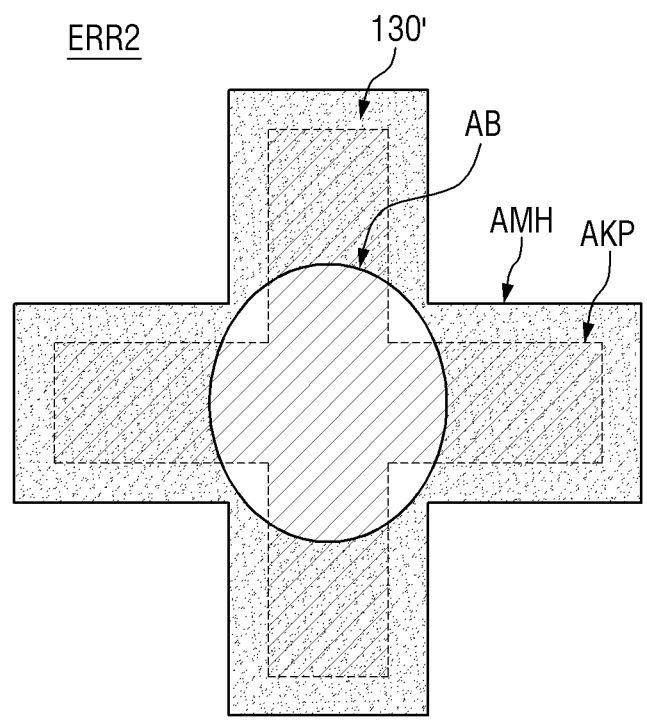
Figure 13:
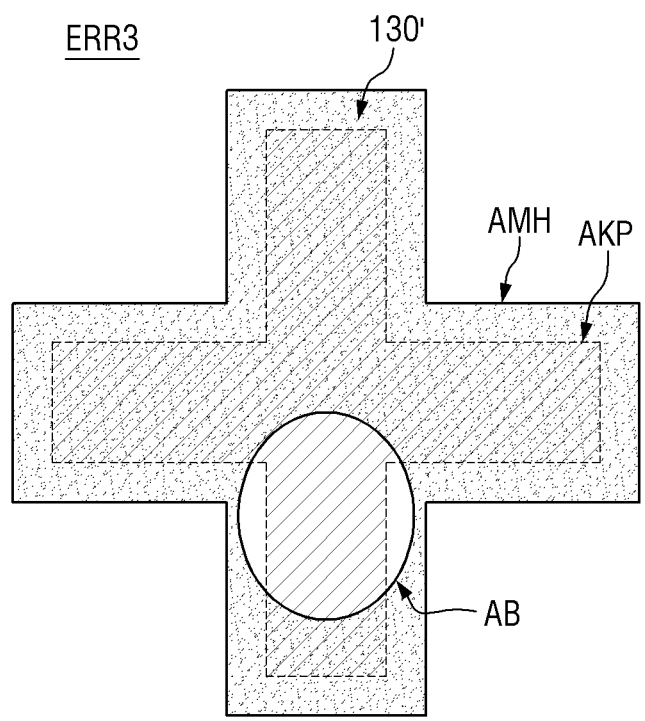

In this case, when the air bubble AB is inserted into or enters into the align matching hole AMH as illustrated in FIGS. 12 and 13, the position, size and shape of the air bubble AB may be reflected in a planar shape of the align matching hole AMH. Accordingly, the overlapping shape between the align matching hole AMH and the align key pattern AKP may be deformed.

In some embodiments, whether the alignment state of the first and second substrates 110 and 120 is normal is verified through the overlapping shape between the align matching hole AMH and the align key pattern AKP.

However, as shown in FIGS. 10, 12 and 13, when the overlapping shape between the align matching hole AMH and the align key pattern AKP is deformed by the foreign substances 130' and AB inserted into the align matching hole AMH, an alignment detection error occurs in which the alignment state of the first and second substrates 110 and 120 is classified as defective, regardless of whether the alignment state of the first and second substrates 110 and 120 is actually normal or not. Such alignment detection errors may result in unnecessary or undesirable yield reduction.

Accordingly, the display panel 10 according to some embodiments further includes a filling pattern FLP filling the align matching hole AMH so that the align matching hole AMH is not in a cavity state.

The filling pattern FLP may be disposed in the align matching hole AMH and may be in contact with a portion of the second base substrate 121 exposed by the align matching hole AMH.

The filling pattern FLP may be formed of the same material as the filling layer 130. In this way, it is possible to reduce the complexity of the fabricating process due to the addition of the filling pattern FLP.

For example, the filling pattern FLP and the filling layer 130 may be formed of a Si-based organic material, an epoxy-based organic material, and/or the like.

As described above, because the display panel 10 according to some embodiments includes the filling pattern FLP, it is advantageous in preventing or blocking foreign substances due to process defects from being inserted into the align matching hole AMH. Accordingly, because the deformation of the overlapping shape between the align matching hole AMH and the align key pattern AKP can be prevented or reduced, an alignment detection error can be prevented or reduced, and unnecessary or undesirable yield reduction can be prevented or reduced.

In some embodiments, because the cross section of the light blocking structure 122 exposed by (e.g., corresponding to) the align matching hole AMH is covered with the filling pattern FLP, separation of the light blocking structure 122 may be prevented or reduced. Accordingly, the life span and the quality uniformity of the display panel 10 may be improved.

Next, a display panel according to some other embodiments will be described with reference to FIGS. 14, 15 and 16.

Figure 14:
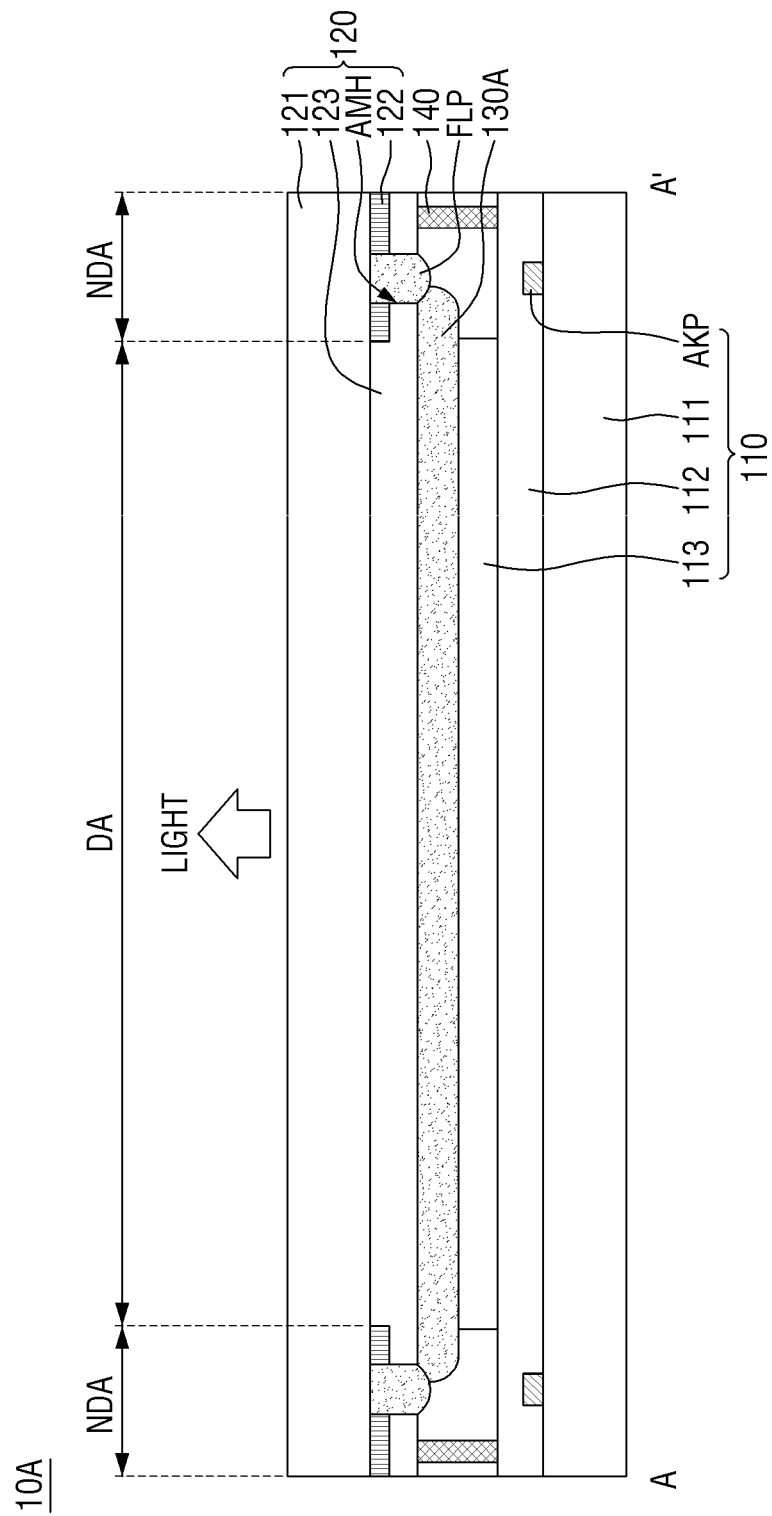
FIGS. 14, 15, and 16 are cross-sectional views of a display panel according to some other embodiments.
Figure 15:
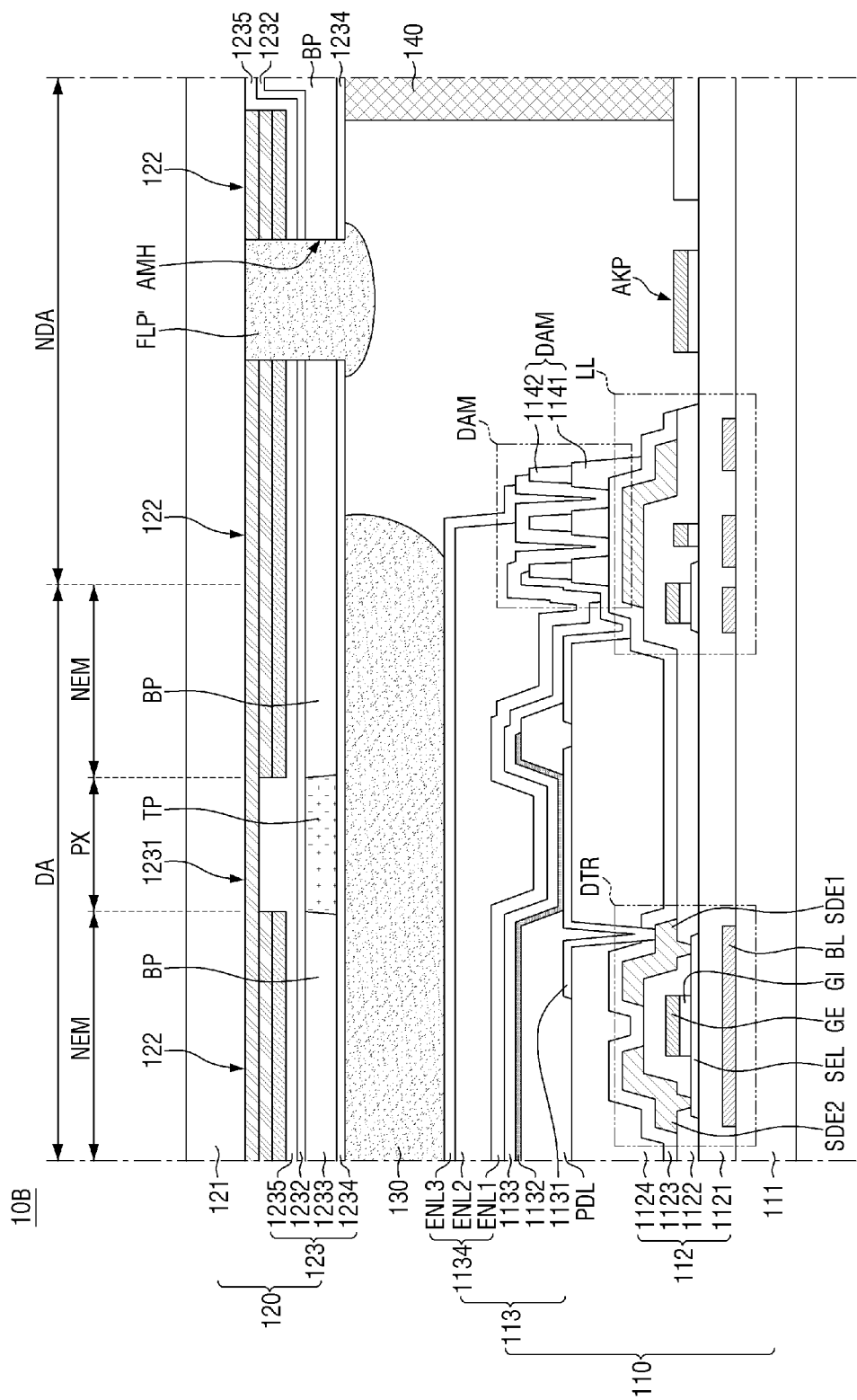
Figure 16:
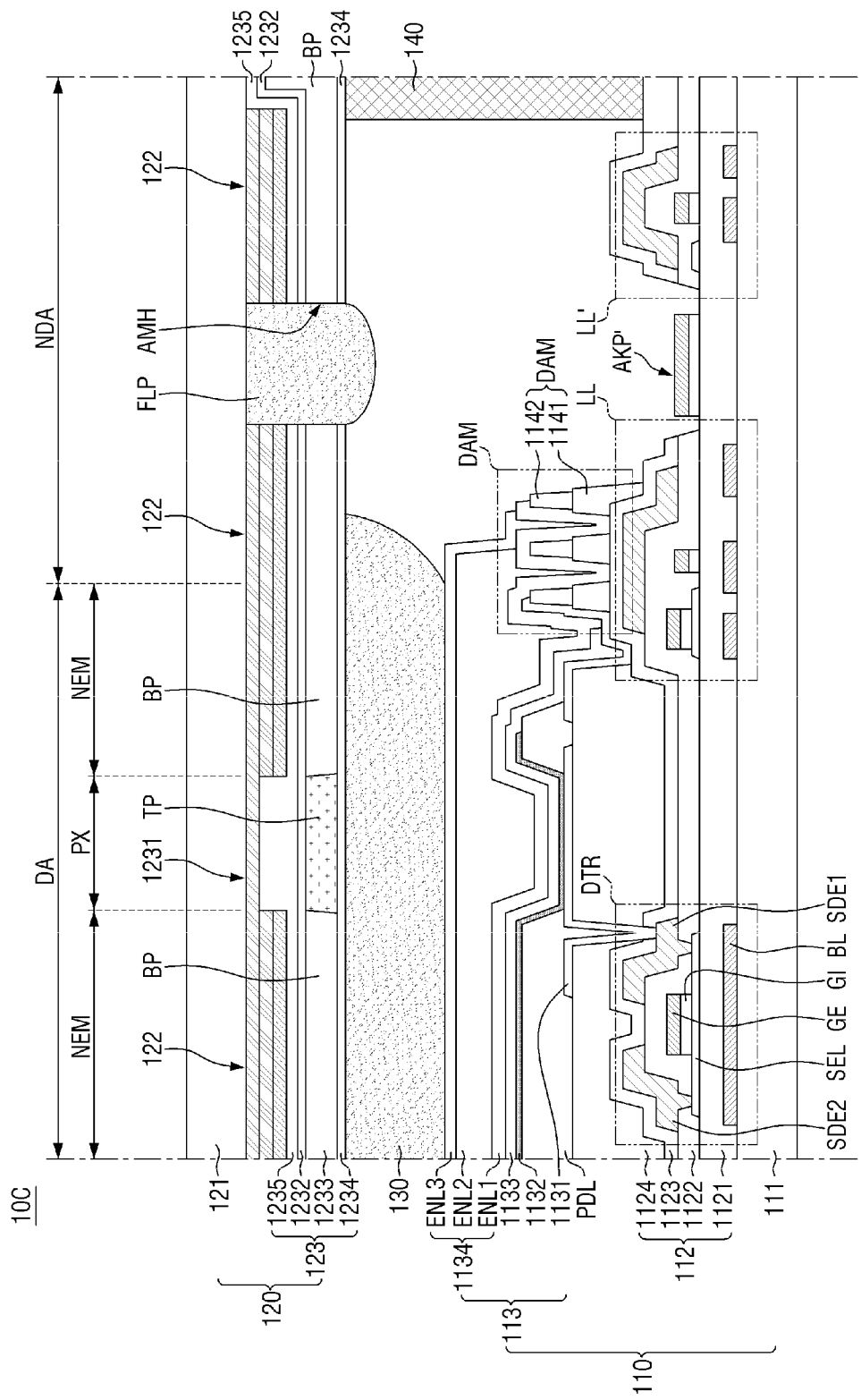

FIGS. 14, 15, and 16 are cross-sectional views of a display panel according to some other embodiments.

Referring to FIG. 14, a display panel 10A according to a first embodiment is the same as the display panel 10 according to the embodiment of FIGS. 1 to 7 except that a filling layer 130A is in contact with at least a part of the filling pattern FLP, and thus, redundant description may not be provided.

According to the first embodiment of FIG. 14, because the filling layer 130A is formed of a filling material greater than the normal amount, it may be extended outside the display area DA to be disposed in a part of the non-display area NDA. Here, the normal amount of the filling material may correspond to a gap between the first and second substrates 110 and 120 and the width of the display area DA.

However, in order to prevent or reduce a decrease in the adhesive force of the sealing pattern 140 due to the filling layer 130A, the filling layer 130A in an amount greater than the normal amount may extend to the non-display area NDA without being in contact with the sealing pattern 140.

The filling layer 130A extending to the non-display area NDA may be in contact with at least a part of the filling pattern FLP. However, because the align matching hole AMH is in a state filled by the filling pattern FLP, the filling layer 130A extending to the non-display area NDA may not invade the align matching hole AMH. Accordingly, because a defect in which the foreign substance is inserted into the align matching hole AMH can be prevented, or reduced in occurrence or severity, regardless of the filling layer 130A in an amount greater than the normal amount, process workability may be improved while preventing or reducing reduction in yield.

Referring to FIG. 15, a display panel 10B according to a second embodiment is the same as the display panel 10 according to the embodiment of FIGS. 1 to 7 except that a filling pattern FLP' fills the align matching hole AMH and overlaps the second base substrate 121 around the align matching hole AMH, and thus, redundant description may not be provided. For example, the filling pattern FLP' may overlap in the plan view a region adjacent to the align matching hole AMH of one or more selected from among the light blocking structure 122, the low refractive layer 1235, the first capping layer 1232, the bank pattern BP, and the second capping layer 1234.

According to the second embodiment of FIG. 15, because the filling pattern FLP' is formed of a greater amount of the filling material than the interior of the align matching hole AMH, it extends around the align matching hole AMH and overlaps the second base substrate 121 on the second capping layer 1234.

However, in order to prevent or reduce a decrease in the adhesive force of the sealing pattern 140 due to the filling pattern FLP', the filling pattern FLP' in an amount greater than the normal amount may extend around the align matching hole AMH without being in contact with the sealing pattern 140.

In this way, the uniformity of the structure in which the align matching hole AMH is entirely filled by the filling pattern FLP' may be improved while the complexity of the process of adjusting the amount of filling material may be reduced.

Referring to FIG. 16, a display panel 10C according to a third embodiment is the same as the display panel 10 according to the embodiment of FIGS. 1 to 7 except that an align key pattern AKP' is disposed between the conductive patterns of the non-display area NDA such as link lines LL and LL', and thus, redundant description may not be provided.

As described above, the align key pattern AKP may be disposed at any point of the display area DA and the non-display area NDA as long as it is spaced apart from the opaque patterns that may be around (e.g., surround) the align key pattern AKP (e.g., in the plan view) and that are disposed on the same layer and/or different layers.

For example, the align key pattern AKP according to the third embodiment may be disposed between the link lines LL and LL' as illustrated in FIG. 16.

In some embodiments, the align key pattern AKP may be disposed in the scan driver 20 mounted on the non-display area NDA.

As described above, because the position of the align key pattern AKP does not need to be limited to an area adjacent to the edge of the first base substrate 111, the design complexity of the display panel 10 may be reduced.

Next, a method for fabricating a display panel will be described in reference to FIGS. 17, 18, 19, 20, 21, 22, 23, 24, 25 and 26.

Figure 17:
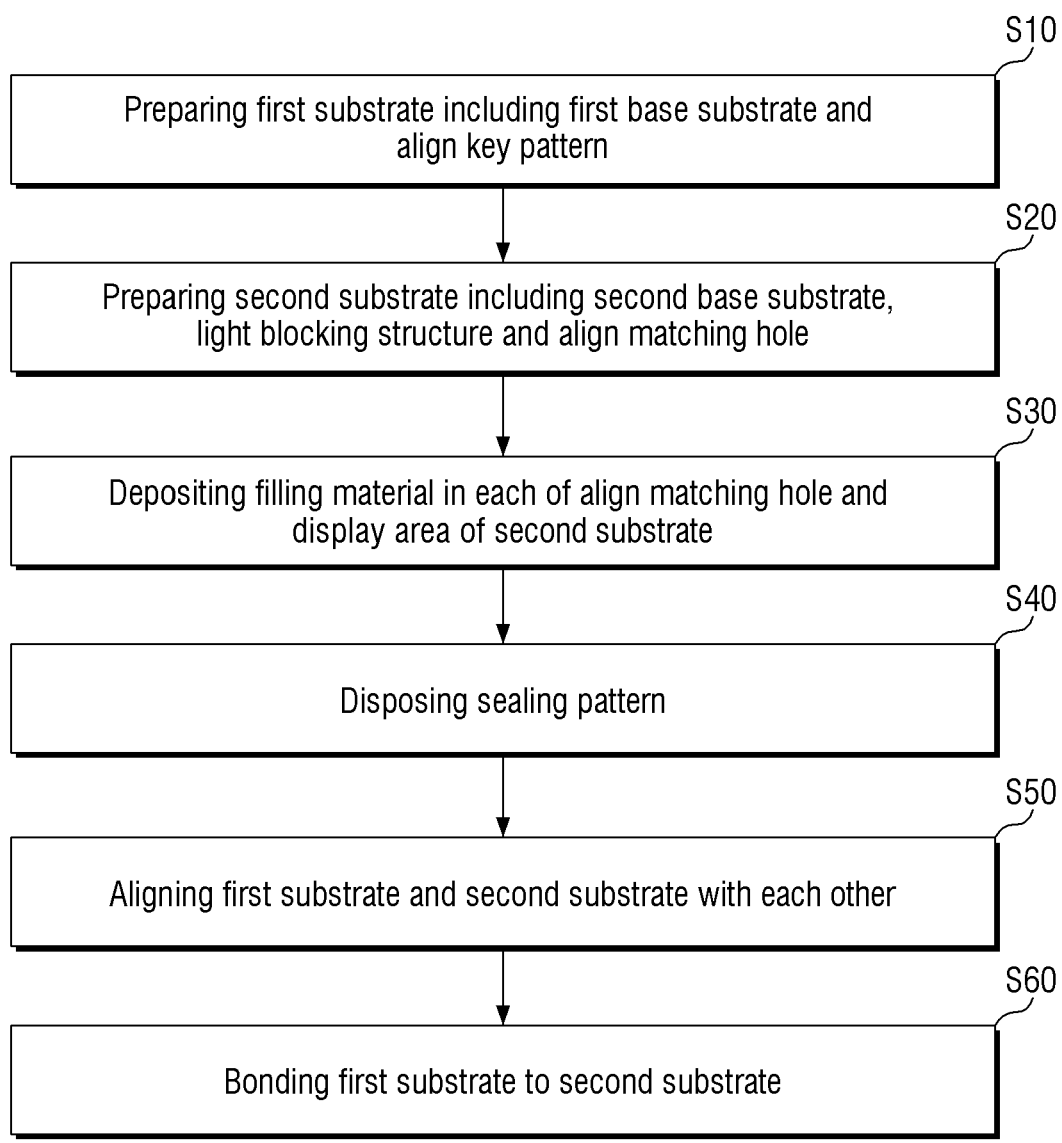
FIG. 17 is a flowchart showing a method for fabricating a display panel according to some embodiments.

FIG. 17 is a flowchart showing a method for fabricating a display panel according to some embodiments.

FIGS. 18, 19, 20, 21, 22, 23, 24, 25 and 26 are cross-sectional views of respective acts of FIG. 17.

Referring to FIG. 17, a method for fabricating a display panel according to some embodiments includes preparing a first substrate 110 including a first base substrate 111 and an align key pattern AKP (act S10), preparing a second substrate 120 including a second base substrate 121, a light blocking structure 122 and an align matching hole AMH (act S20), depositing a filling material in each of the align matching hole AMH and a display area DA on the second substrate 120 (act S30), placing a sealing pattern 140 on any one of the first and second substrates 110 and 120 (act S40), aligning the first substrate 110 and the second substrate 120 with each other utilizing or based on the align key pattern AKP and the align matching hole AMH (act S50), and bonding the first substrate 110 to the second substrate 120 (act S60).

Figure 18:
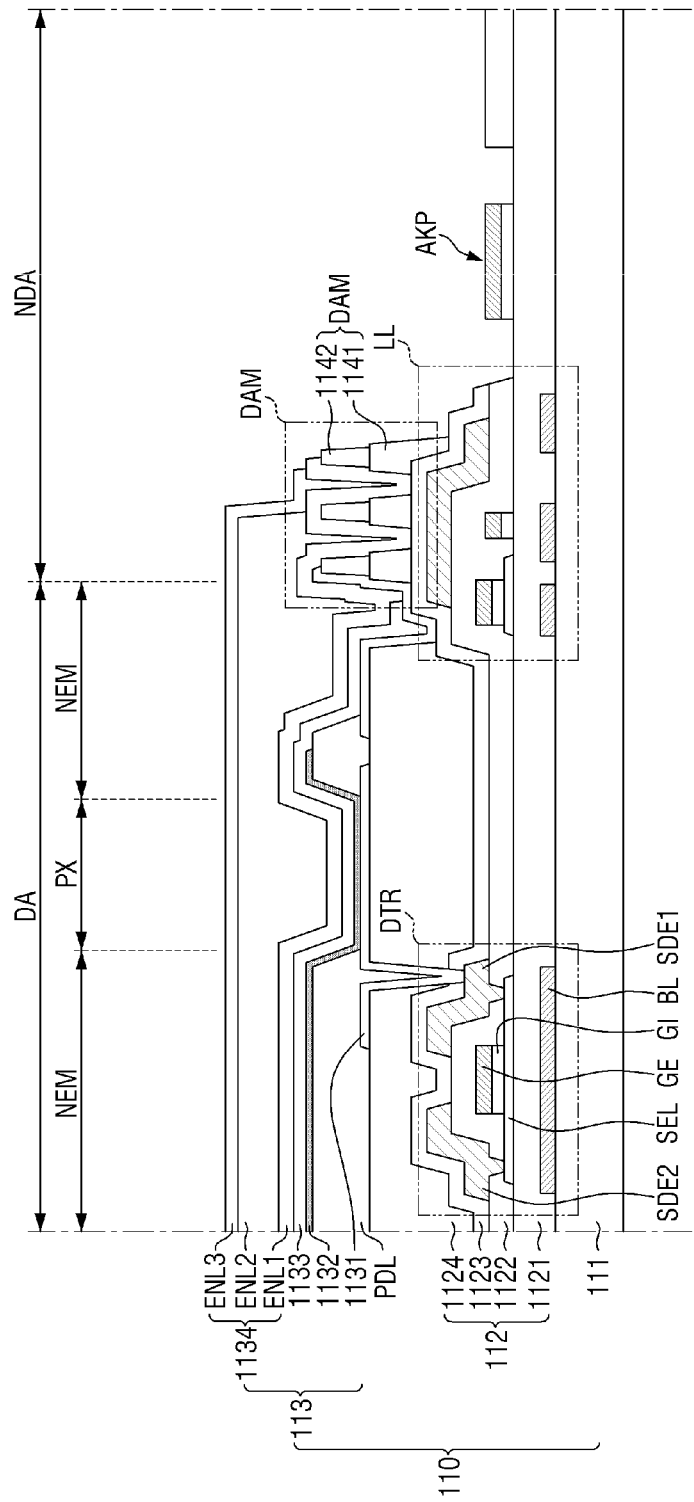

Referring to FIG. 18, the act S10 of preparing the first substrate 110 may include a process of placing the circuit array 112 and the align key pattern AKP on the first base substrate 111 and a process of placing the light emitting array 113 on the circuit array 112.

The first base substrate 111 includes the display area DA in which the plurality of pixel areas PX are arranged and the non-display area NDA around the display area DA.

The circuit array 112 includes the plurality of driving transistors DTR corresponding to the plurality of pixel areas PX.

The light emitting array 113 includes the plurality of light emitting elements EMD corresponding to the plurality of pixel areas PX.

In some embodiments, the process of placing the circuit array 112 and the align key pattern AKP may include a process of patterning a semiconductor material layer to place a semiconductor layer SEL, a process of patterning a first insulating material layer and a first conductive material layer which cover the semiconductor layer SEL and are sequentially stacked to place a gate insulating layer GI and a gate electrode GE on the channel area CA of the semiconductor layer SEL, and a process of patterning a second conductive material layer on the interlayer insulating layer 1122 to place a source electrode SDE1 and a drain electrode SDE2.

Here, in one of the process of placing the gate electrode GE and the process of placing the source electrode SDE1 and the drain electrode SDE2, the align key pattern AKP corresponding to a part of the non-display area NDA may be prepared. For example, the align key pattern AKP may be on the same layer as the gate electrode GE is on, or be disposed on the same layer as the source electrode SDE1 and the drain electrode SDE2 are on. Also, in the plan view, the align key pattern AKP is spaced apart (e.g., spaced apart in the plan view) from other conductive patterns disposed on the same layer or different layers as the align key pattern AKP is on.

The semiconductor layer SEL includes the set or predetermined channel area CA, and the source area SDA1 and the drain area SDA2, which are both (e.g., simultaneously) sides of the channel area CA.

The gate electrode GE overlaps the channel area CA of the semiconductor layer SEL with the gate insulating layer GI interposed therebetween.

The process of placing the circuit array 112 and the align key pattern AKP may further include a process of patterning the interlayer insulating layer 1122 to place a hole partially exposing each of the source area SDA1 and the drain area SDA2 included in the semiconductor layer SEL before the process of placing the source electrode SDE1 and the drain electrode SDE2.

Accordingly, in the process of placing the source electrode SDE1 and the drain electrode SDE2, the source electrode SDE1 is coupled (e.g., connected) to the source area SDA1 of the semiconductor layer SEL and the drain electrode SDE2 is coupled (e.g., connected) to the drain area SDA2 of the semiconductor layer SEL.

Moreover, when the semiconductor layer SEL is formed of an oxide semiconductor, the process of placing the circuit array 112 and the align key pattern AKP may further include a process of patterning a light blocking material layer on the first base substrate 111 to place the barrier layer BL corresponding to each pixel area PX and a process of placing the buffer layer 1121 covering the barrier layer BL on the first base substrate 111 before the process of placing the semiconductor layer SEL. In this case, the semiconductor layer SEL is disposed on the buffer layer 1121. In this way, it is possible to prevent or reduce the threshold voltage characteristic of the semiconductor layer SEL from being changed by light.

In some embodiments, the process of placing the circuit array 112 and the align key pattern AKP may further include sequentially stacking the auxiliary interlayer insulating layer 1123 covering the source electrode SDE1 and the drain electrode SDE2 and the via layer 1124 on the interlayer insulating layer 1122 after the process of placing the source electrode SDE1 and the drain electrode SDE2.

The auxiliary interlayer insulating layer 1123 and the via layer 1124 may be for electrically protecting the conductive patterns of the circuit array 112 and removing a step due to the conductive patterns of the circuit array 112.

In some embodiments, a link line LL of the non-display area NDA may also be prepared by at least one selected from the process of placing the barrier layer BL, the process of placing the semiconductor layer SEL, the process of placing the gate electrode GE, and/or the process of placing the source electrode SDE1 and the drain electrode SDE2.

The process of placing the light emitting array 113 on the circuit array 112 may include a process of patterning the auxiliary interlayer insulating layer 1123 and the via layer 1124 to dispose a hole partially exposing the source electrode SDE1, a process of patterning a third conductive material layer on the via layer 1124 to dispose the pixel electrode 1131 in each pixel area PX, a process of patterning a second insulating material layer on the via layer 1124 covering the pixel electrode 1131 to dispose the pixel defining layer PDL corresponding to the non-emission area NEM, a process of placing the light emitting layer 1132 on the pixel electrode 1131, a process of placing the common electrode 1133 on the light emitting layer 1132 and a process of placing the encapsulating structure 1134 on the common electrode 1133.

In the process of patterning the auxiliary interlayer insulating layer 1123 and the via layer 1124 to dispose a hole partially exposing the source electrode SDE1, the first dam layer 1141 of each of the dam structures DAM of the non-display area NDA may also be prepared.

In some embodiments, in the process of disposing the pixel defining layer PDL, the second dam layer 1142 of each of the dam structures DAM of the non-display area NDA may also be prepared.

The encapsulating structure 1134 may have a structure in which two or more inorganic insulating encapsulation layers ENL1 and ENL3 and at least one organic insulating encapsulation layer ENL2 are alternately stacked.

The act S20 of preparing the second substrate 120 may include a process of disposing the light blocking structure 122 and the color filter layer 1231 on the second base substrate 121, a process of disposing the first capping layer 1232 covering the light blocking structure 122 and the color filter layer 1231, and a process of patterning the light blocking structure 122 and the first capping layer 1232 to dispose the align matching hole AMH.

Like the first base substrate 111, the second base substrate 121 includes the display area DA and the non-display area NDA, and the display area DA includes a plurality of pixel areas PX arranged, for example, in parallel with each other and the non-emission area NEM which is the boundary between the plurality of pixel areas PX.

Each of the plurality of pixel areas PX may correspond to any one of first, second or third colors different from each other.

In some embodiments, the third color may be a shorter wavelength region than the second color, and the second color may be a shorter wavelength region than the first color. For example, the first color may be a red color, the second color may be a green color and the third color may be a blue color.

Figure 19:
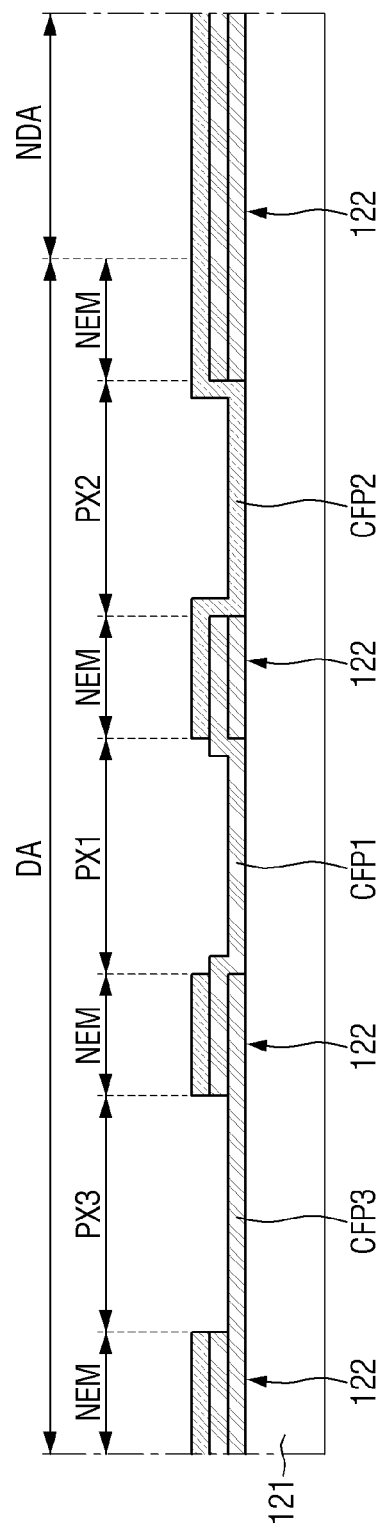

Referring to FIG. 19, the process of disposing the light blocking structure 122 and the color filter layer 1231 may include a process of disposing the third color filter pattern CFP3 which is configured to transmit light of a third color in the non-display area NDA, the non-emission area NEM and the third pixel area PX3 corresponding to the third color among the plurality of pixel areas PX, a process of disposing the first color filter pattern CFP1 which is configured to transmit light of a first color in the non-display area NDA, the non-emission area NEM and the first pixel area PX1 corresponding to the first color among the plurality of pixel areas PX, and a process of disposing the second color filter pattern CFP2 which is configured to transmit light of a second color in the non-display area NDA, the non-emission area NEM and the second pixel area PX2 corresponding to the second color among the plurality of pixel areas PX.

In this case, the light blocking structure 122 is formed of a stacked structure of the third color filter pattern CFP3, the first color filter pattern CFP1 and the second color filter pattern CFP2.

In some embodiments, the color filter layer 1231 is formed of first, second, and third color filter patterns CFP1, CFP2 and CFP3.

Figure 20:
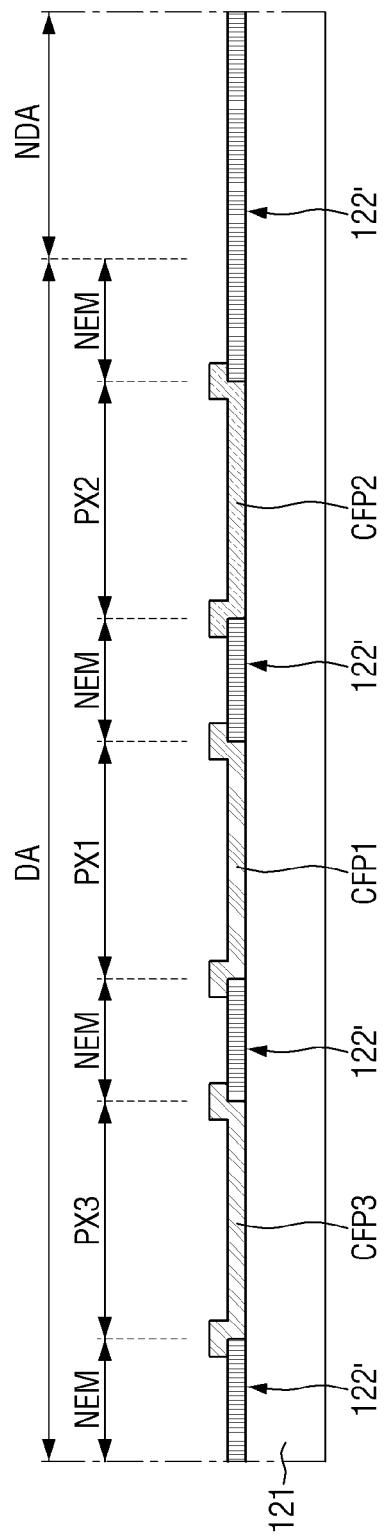

In some embodiments, referring to FIG. 20, the process of disposing the light blocking structure and the color filter layer 1231 may include a process of patterning a light absorbing material layer on the second base substrate 121 to dispose a light blocking structure 122' corresponding to the non-display area NDA and the non-emission area NEM, a process of disposing the first color filter pattern CFP1 in the first pixel area PX1 corresponding to the first color among the plurality of pixel areas PX on the second base substrate 121, a process of disposing the second color filter pattern CFP2 in the second pixel area PX2 corresponding to the second color among the plurality of pixel areas PX on the second base substrate 121, and a process of disposing the third color filter pattern CFP3 in the third pixel area PX3 corresponding to the third color among the plurality of pixel areas PX on the second base substrate 121.

Figure 21:
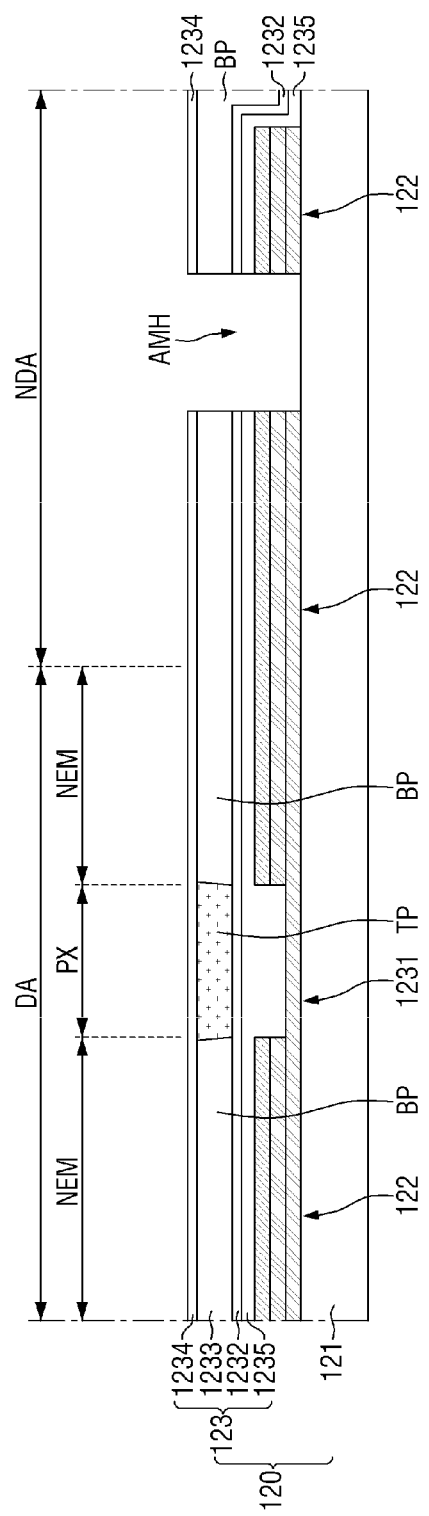

Referring to FIG. 21, the act S20 of preparing the second substrate 120 may further include a process of disposing the color conversion layer 1233 on the first capping layer 1232 and a process of disposing the second capping layer 1234 covering the color conversion layer 1233 before the process of disposing the align matching hole AMH.

In some embodiments, the act S20 of preparing the second substrate 120 may further include a process of disposing a low refractive layer 1235 on the color filter layer 1231 before the process of disposing the first capping layer 1232.

In the case where a plurality of light emitting elements EMD included in the light emitting array 113 emit light of a single color, the color conversion layer 1233 is to convert the light of the light emitting element EMD to light of a different color and to emit the light through each pixel area PX.

In the case where the plurality of light emitting elements EMD emit light of the third color, the color conversion layer 1233 may include a bank pattern BP disposed in the non-display area NDA and the non-emission area NEM, the first color conversion pattern CCP1 corresponding to the first color filter pattern CFP1 and to convert the light of the third color emitted from the light emitting element EMD into light of the first color, the second color conversion pattern CCP2 corresponding to the second color filter pattern CFP2 and to convert the light of the third color emitted from the light emitting element EMD into light of the second color, and the transmitting pattern TP corresponding to the third color filter pattern CFP3 and to transmit light of the third color emitted from the light emitting element EMD.

The low refractive layer 1235 may be formed of a material having a lower refractive index than the color conversion layer 1233.

The low refractive layer 1235 may recycle the light by returning a part of the light emitted from the color conversion layer 1233 back to the color conversion layer 1233. Accordingly, the light efficiency of the display panel 10 may be improved by the low refractive layer 1235.

In the process of arranging the align matching hole AMH, the components on the non-display area NDA of the second base substrate 121 including the light blocking structure 122 may be patterned. In some embodiments, in the case where the low refractive layer 1235, the first capping layer 1232, the bank pattern BP of the color conversion layer 1233, and the second capping layer 1234 are disposed together with the light blocking structure 122 on the non-display area NDA as illustrated in FIG. 21, the light blocking structure 122, the low refractive layer 1235, the first capping layer 1232, the bank pattern BP of the color conversion layer 1233 and the second capping layer 1234 may be patterned to prepare the align matching hole AMH.

Figure 22:
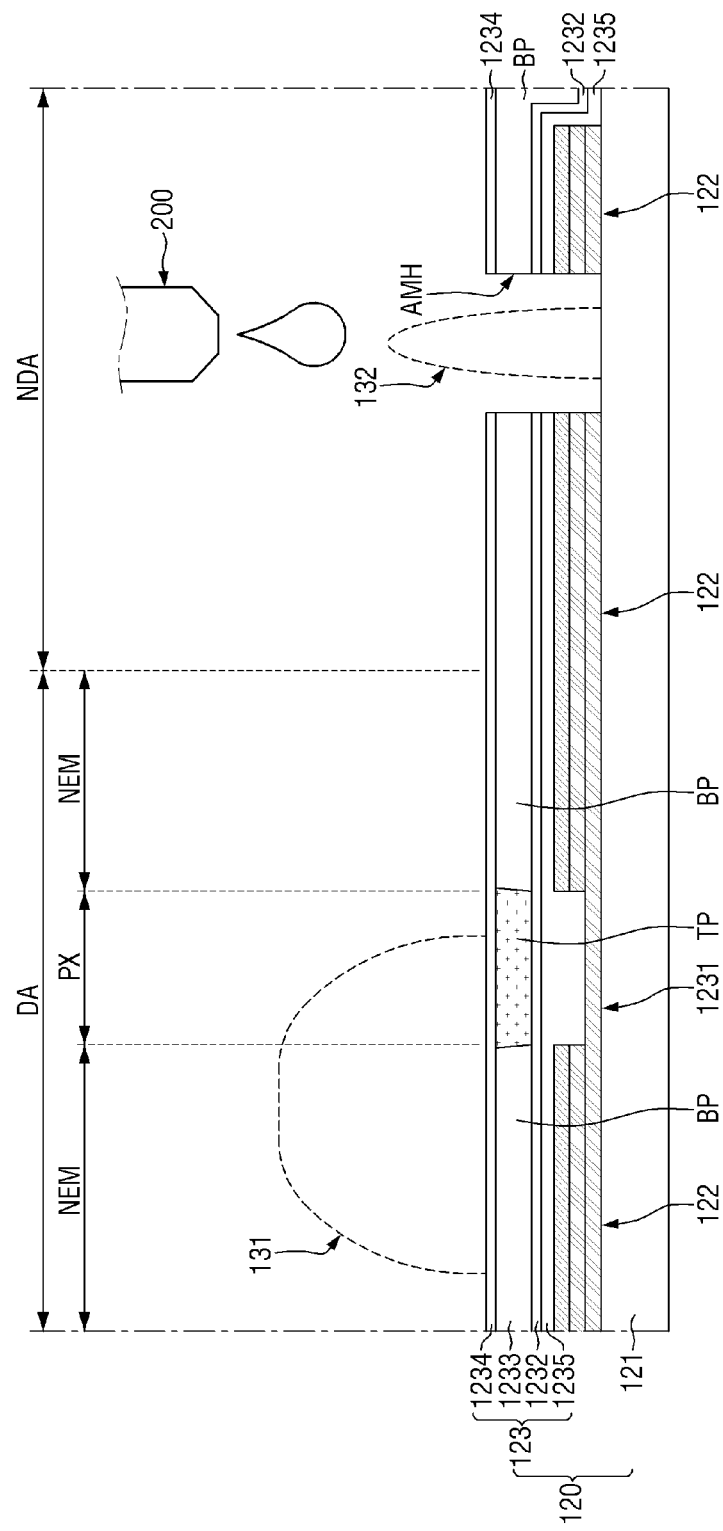

Referring to FIG. 22, after preparing the second substrate 120, filling materials 131 and 132 are deposited on the display area DA and the align matching hole AMH of the second substrate 120 through a nozzle 200 that may be moveable (e.g., that is moveable relative to the second substrate 120) on a plane (act S30).

For example, the nozzle 200 may drop the filling material 131 in an amount corresponding to (e.g., sufficient to fill and/or no more than an amount sufficient to fill) the gap between the first substrate 110 and the second substrate 120, and the display area DA at least at one point in the display area DA of the second substrate 120. Also, the nozzle 200 may move over the align matching hole AMH of the second substrate 120 and drops the filling material 132 in an amount corresponding to (e.g., sufficient to fill and/or no more than an amount sufficient to fill) the align matching hole AMH into the align matching hole AMH.

At this time, the order between the process of depositing the filling material 131 in the display area DA of the second substrate 120 and the process of depositing the filling material 132 into the align matching hole AMH may be changed according to convenience in the process.

Figure 23:
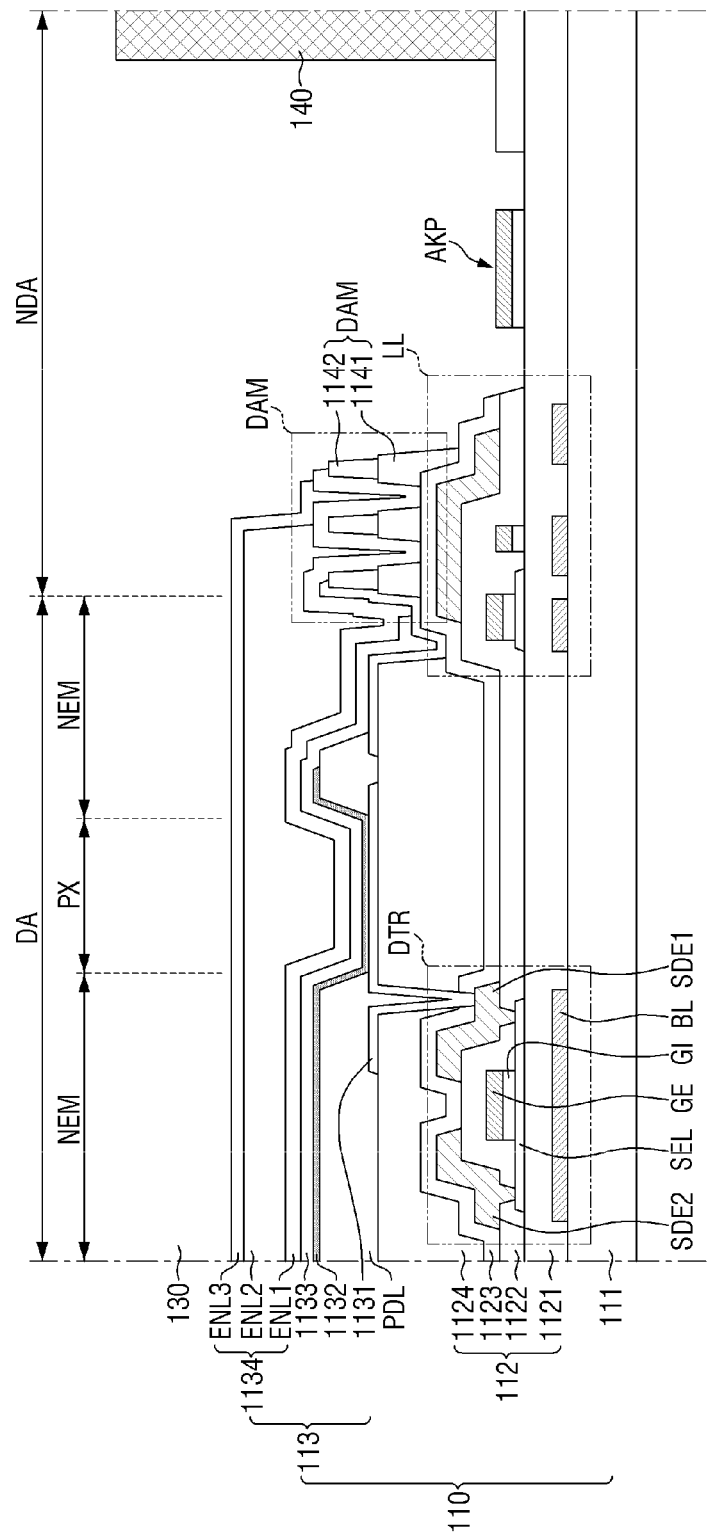

Referring to FIG. 23, after the first and second substrates 110 and 120 are prepared, a sealing pattern 140 is disposed on at least one selected from the first and second substrates 110 and 120 (act S40).

The sealing pattern 140 is for bonding the first and second substrates 110 and 120 and may have a frame shape adjacent to an edge of any one of the first and second base substrates 111 and 121.

In one example, as illustrated in FIG. 23, in the act S40 of disposing the sealing pattern 140, the sealing pattern 140 may be disposed on the first substrate 110. On the other hand, the sealing pattern 140 may be disposed on the second substrate 120 or be disposed on both the first and second substrates 110 and 120. For example, a first sealing pattern may be disposed on the first substrate 110 and a second sealing pattern may be disposed on the second substrate 120.

Figure 24:
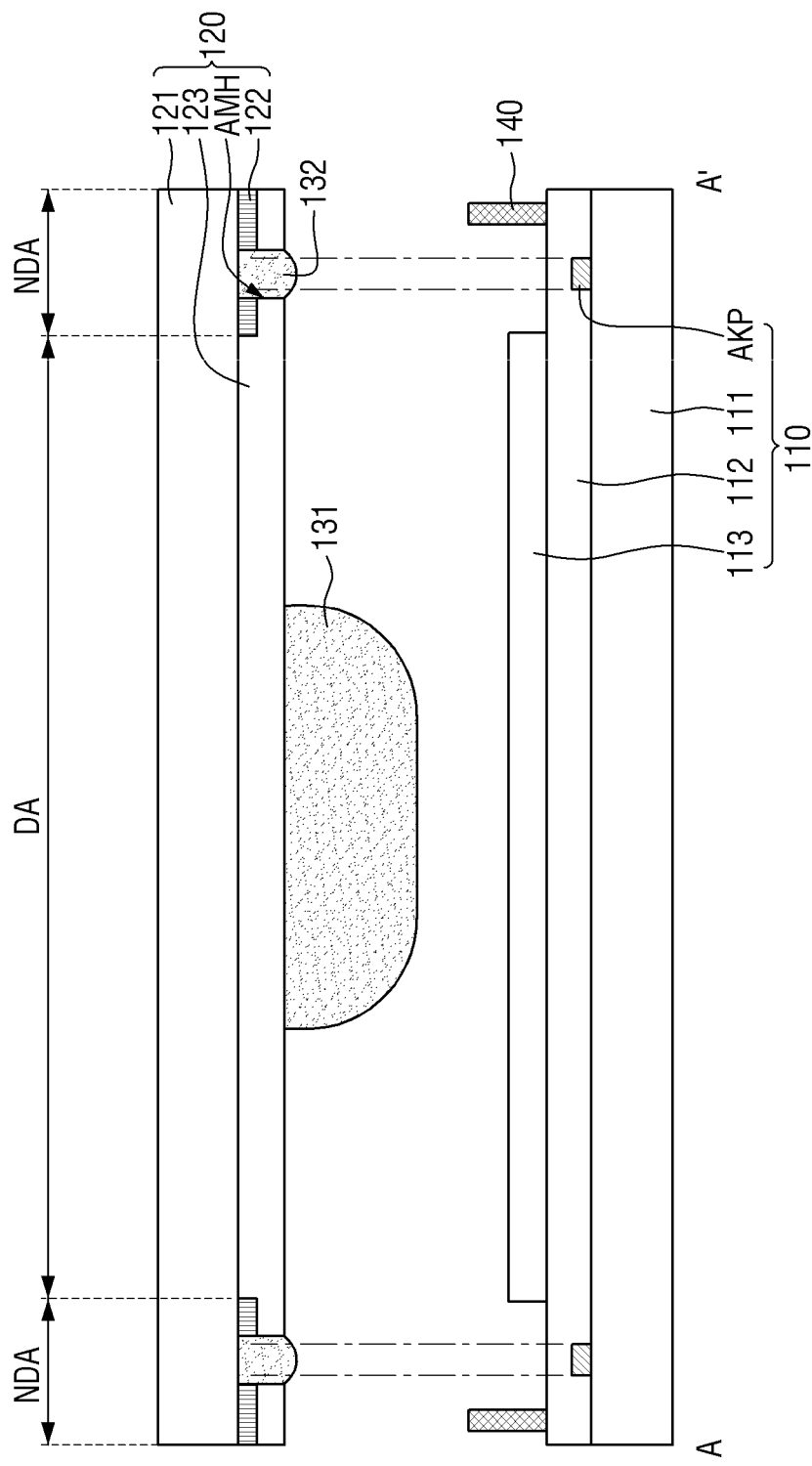

Referring to FIG. 24, the first and second substrates 110 and 120 are arranged to overlap (e.g., face) each other by utilizing the align key pattern AKP and the align matching hole AMH (act S50).

In some embodiments, in the act S50 of aligning the first and second substrates 110 and 120, whether the bonding state of the first and second substrates 110 and 120 is normal or not may be verified based on the planar shape in which the align key pattern AKP and the align matching hole AMH overlap each other.

For example, when the align key pattern AKP is disposed in the align matching hole AMH in a planar shape in which the align key pattern AKP and the align matching hole AMH overlap each other, the bonding state of the first and second substrates 110 and 120 may be checked to be normal. For example, when the align key pattern AKP sufficiently overlaps with the matching hole AMH in the plan view, the bonding state of the first and second substrates 110 and 120 may be considered to be normal.

Figure 25:
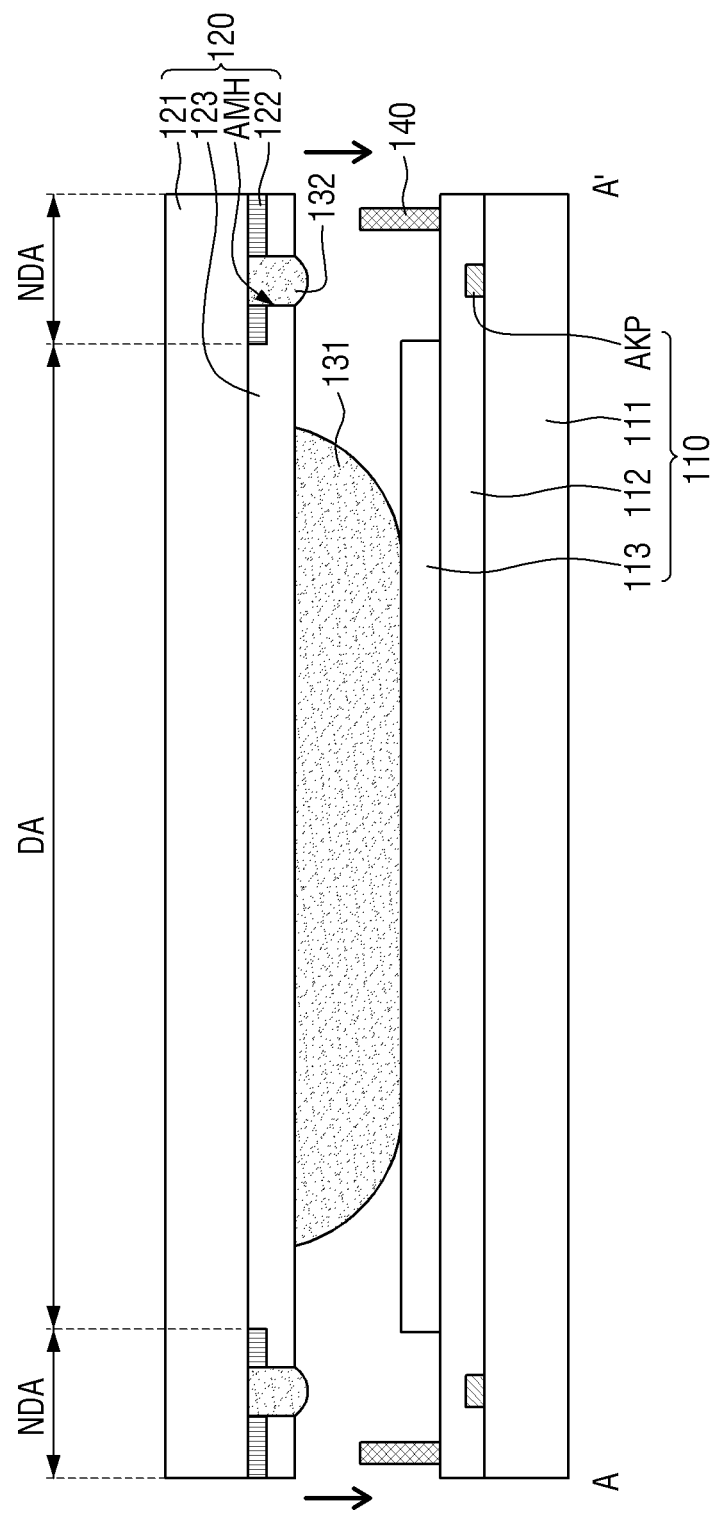

Referring to FIG. 25, at least one selected from the first and second substrates 110 and 120 aligned with each other may be moved so that the first and second substrates 110 and 120 may be disposed close to each other.

At this time, while the separation distance between the first and second substrates 110 and 120 decreases, the filling material 131 deposited on the display area DA of the second substrate 120 is compressed by the first substrate 110 adjacent to the second substrate 120 and spread widely in the display area DA.

Then, referring to FIG. 26, the first and second substrates 110 and 120 may be bonded with each other through the sealing pattern 140 to prepare the display panel 10.

At this time, the filling material 131 deposited on the display area DA of the second substrate 120 may be spread to fill at least the display area DA of the gap between the first and second substrates 110 and 120, thereby preparing the filling layer 130.

In some embodiments, the filling pattern FLP filling the align matching hole AMH is prepared by the filling material 132 deposited into the align matching hole AMH of the second substrate 120.

As described above, according to some embodiments, when depositing the filling material 131 to form the filling layer 130, the filling material 132 may be dropped not only in the display area DA of the second substrate 120 but also into the align matching hole AMH. For example, because there may be no need to add a separate process for forming the filling pattern FLP, it is possible to prevent the fabricating process from becoming complicated due to the filling pattern FLP, or to reduce such complication.

However, the aspects of the present disclosure are not restricted to the one or more aspects set forth herein. The above and other aspects of the disclosure will become more apparent to one of ordinary skill in the art to which the present disclosure pertains by referencing the claims, with functional equivalents thereof to be included therein.

What is claimed is:

1. A display panel comprising:
   a first substrate comprising:
      a first base substrate which comprises a display area comprising a plurality of pixel areas for image display and a non-display area around the display area, and
      an align key pattern comprising an opaque material in a part of the non-display area;
   a second substrate comprising:
      a second base substrate overlapping the first base substrate and comprising a transparent material,
      a light blocking structure on the second base substrate and in the non-display area, and
      a hole overlapping the align key pattern and penetrating the light blocking structure;
   a filling pattern configured to fill the hole;
   a filling layer corresponding to at least the display area and filling a gap between the first substrate and the second substrate; and
   a sealing pattern corresponding to an edge of at least one selected from the first and second base substrates, between the first and second substrates, and bonding the first and second substrates to each other,
   wherein the filling pattern and the filling layer are spaced apart from the sealing pattern.

2. The display panel of claim 1, wherein the filling pattern is the same as the filling layer in material.

3. The display panel of claim 2, wherein the display area further comprises a non-emission area which is a boundary between the plurality of pixel areas,
   wherein the light blocking structure of the second substrate is further in the non-emission area,
   wherein the second substrate further comprises:
   a color filter layer in the plurality of pixel areas; and
   a first capping layer covering the light blocking structure and the color filter layer, and
   wherein a portion of the second base substrate corresponding to the hole is in contact with the filling pattern.

4. The display panel of claim 1, wherein the filling layer extends at least to the non-display area and is in contact with at least a part of the filling pattern.

5. The display panel of claim 3, wherein each of the plurality of pixel areas corresponds to any one of first, second, and third colors, the first, second, and third colors being different from each other, and
   wherein the color filter layer comprises:
   a first color filter pattern configured to transmit light of the first color;
   a second color filter pattern configured to transmit light of the second color; and
   a third color filter pattern configured to transmit light of the third color.

6. The display panel of claim 5, wherein the light blocking structure comprises a stack of a portion of the first color filter pattern, a portion of the second color filter pattern, and a portion of the third color filter pattern.

7. The display panel of claim 5, wherein the first substrate further comprises:
   a circuit array on the first base substrate and comprising a plurality of driving transistors corresponding to the plurality of pixel areas, and a light emitting array on the circuit array and comprising a plurality of light emitting elements corresponding to the plurality of pixel areas.

8. The display panel of claim 7, wherein each of the plurality of driving transistors comprises:
- a semiconductor layer comprising a channel area, a source area, and a drain area, the source area and the drain area being spaced apart from each other with the channel area therebetween;
- a gate electrode overlapping the channel area of the semiconductor layer;
- a source electrode coupled to the source area of the semiconductor layer; and
- a drain electrode coupled to the drain area of the semiconductor layer, and
- wherein the align key pattern is on the same layer as at least one selected from the gate electrode, the source electrode, and the drain electrode is on, is an island pattern, and overlaps the filling pattern.

9. The display panel of claim 5, wherein the second substrate further comprises:
- a color conversion layer on the first capping layer;
- a second capping layer covering the color conversion layer; and
- a low refractive layer between the color filter layer and the color conversion layer and comprising a material having a lower refractive index than that of the color conversion layer, and
- wherein the color conversion layer comprises:
- a bank pattern around each of the plurality of pixel areas and in the non-display area;
- a first color conversion pattern corresponding to the first color filter pattern and to convert light of the third color into light of the first color;
- a second color conversion pattern corresponding to the second color filter pattern and to convert light of the third color into light of the second color; and
- a transmitting pattern corresponding to the third color filter pattern and to transmit light of the third color.

10. A method for fabricating a display panel, the method comprising:
- preparing a first substrate comprising:
- a first base substrate comprising a display area comprising a plurality of pixel areas for image display and a non-display area around the display area, and
- an align key pattern formed of an opaque material in a part of the non-display area;
- preparing a second substrate comprising:
- a second base substrate overlapping the first base substrate and formed of a transparent material,
- a light blocking structure in the non-display area, and
- a hole penetrating the light blocking structure and exposing a part of the second base substrate in the non-display area;
- depositing a filling material on the second substrate in the display area and in the hole;
- disposing a sealing pattern corresponding to an edge of at least one selected from the first and second base substrates on at least one selected from the first and second substrates;
- aligning the first substrate and the second substrate with each other by utilizing the align key pattern and the hole; and
- bonding the first substrate to the second substrate by utilizing the sealing pattern,
- wherein the filling material comprises a filling pattern in the hole and a filling layer filling a gap between the first and second substrates, and the filling pattern and the filling layer are spaced apart from the sealing pattern.

11. The method of claim 10, wherein in the depositing of the filling material, the filling pattern for filling the hole is prepared by the filling material deposited in the hole, and
- wherein in the bonding of the first and second substrates, the filling layer is prepared to fill the gap between the first substrate and the second substrate by the filling material deposited on the second substrate in the display area.

12. The method of claim 11, wherein in the bonding of the first and second substrates, the filling layer extends at least to the non-display area and is in contact with at least a part of the filling pattern.

13. The method of claim 10, wherein the display area further comprises a non-emission area which is a boundary between the plurality of pixel areas, and
- wherein the preparing of the second substrate comprises:
- disposing the light blocking structure corresponding to the non-emission area and the non-display area, and a color filter layer corresponding to the plurality of pixel areas, on the second base substrate;
- disposing a first capping layer covering the light blocking structure and the color filter layer; and
- providing the hole by patterning the light blocking structure and the first capping layer.

14. The method of claim 13, wherein each of the plurality of pixel areas corresponds to any one of first, second, and third colors, the first, second, and third colors being different from each other,
- wherein the third color is shorter in wavelength than the second color, and the second color is shorter in wavelength than the first color,
- wherein the disposing of the light blocking structure and the color filter layer comprises:
- disposing a third color filter pattern configured to transmit light of the third color in the non-display area, the non-emission area, and pixel areas corresponding to the third color among the plurality of pixel areas;
- disposing a first color filter pattern configured to transmit light of the first color in the non-display area, the non-emission area, and pixel areas corresponding to the first color among the plurality of pixel areas; and
- disposing a second color filter pattern configured to transmit light of the second color in the non-display area, the non-emission area, and pixel areas corresponding to the second color among the plurality of pixel areas, and
- wherein the light blocking structure is formed by stacking a portion of the third color filter pattern, a portion of the first color filter pattern, and a portion of the second color filter pattern.

15. The method of claim 14, wherein the preparing of the second substrate further comprises, before disposing the first capping layer, disposing a low refractive layer on the color filter layer,
- wherein the preparing of the second substrate further comprises, before providing the hole, disposing a color conversion layer on the first capping layer; and disposing a second capping layer covering the color conversion layer,
- wherein, in the providing of the hole, the color conversion layer and the second capping layer are further patterned, and
- wherein the color conversion layer comprises:
- a bank pattern in the non-display area and around each of the plurality of pixel areas;

a first color conversion pattern corresponding to the first color filter pattern and to convert light of the third color into light of the first color;
a second color conversion pattern corresponding to the second color filter pattern and to convert light of the third color into light of the second color; and
a transmitting pattern corresponding to the third color filter pattern and to transmit light of the third color.

16. The method of claim 14, wherein the preparing of the first substrate comprises:
disposing the align key pattern, and a circuit array comprising a plurality of driving transistors corresponding to the plurality of pixel areas, on the first base substrate; and
disposing a light emitting array comprising a plurality of light emitting elements corresponding to the plurality of pixel areas on the circuit array.

17. The method of claim 16, wherein the disposing of the circuit array and the align key pattern comprises:
disposing a semiconductor layer corresponding to each of the plurality of pixel areas and comprising a channel area, a source area, and a drain area, the source area and the drain area being respectively at two sides of the channel area;
disposing a gate insulating layer covering the channel area of the semiconductor layer, and a gate electrode overlapping the channel area of the semiconductor layer with the gate insulating layer therebetween; and
disposing a source electrode coupled to the source area of the semiconductor layer and a drain electrode coupled to the drain area of the semiconductor layer on an interlayer insulating layer covering the semiconductor layer, the gate insulating layer, and the gate electrode, and
wherein the align key pattern is on the same layer as at least one selected from the gate electrode, the source electrode, and the drain electrode is on, and the align key pattern is formed as an island pattern.

18. The method of claim 13, wherein each of the plurality of pixel areas corresponds to any one of first, second, and third colors, the first, second, and third colors being different from each other, and
wherein the disposing of the light blocking structure and the color filter layer comprises:
disposing the light blocking structure by patterning a light absorbing material layer on the second base substrate;
disposing a first color filter pattern configured to transmit light of the first color on pixel areas corresponding to the first color among the plurality of pixel areas;
disposing a second color filter pattern configured to transmit light of the second color on pixel areas corresponding to the second color among the plurality of pixel areas; and
disposing a third color filter pattern configured to transmit light of the third color on pixel areas corresponding to the third color among the plurality of pixel areas.

19. A display panel comprising:
a first substrate comprising a display area comprising a plurality of pixel areas for image display and a non-display area around the display area;
a second substrate overlapping the first substrate and comprising a light blocking structure in the non-display area and a hole penetrating the light blocking structure;
a filling pattern configured to fill the hole;
a filling layer corresponding to at least the display area and filling a gap between the first substrate and the second substrate; and
a sealing pattern corresponding to an edge of at least one selected from the first and second substrates, between the first and second substrates, and bonding the first and second substrates to each other,
wherein the filling pattern is the same as the filling layer in material, and
wherein the filling pattern and the filling layer are spaced apart from the sealing pattern.

* * * * *